(12) United States Patent
Lee et al.

(10) Patent No.: US 11,552,132 B2
(45) Date of Patent: Jan. 10, 2023

(54) DISPLAY DEVICE AND METHOD OF MANUFACTURING THE SAME

(71) Applicant: SAMSUNG DISPLAY CO., LTD., Yongin-si (KR)

(72) Inventors: Hyeon Bum Lee, Hwaseong-si (KR); Beohm Rock Choi, Seoul (KR); Jun Hyuk Woo, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 74 days.

(21) Appl. No.: 17/037,603

(22) Filed: Sep. 29, 2020

(65) Prior Publication Data
US 2021/0242283 A1 Aug. 5, 2021

(30) Foreign Application Priority Data
Feb. 4, 2020 (KR) .................. 10-2020-0013045

(51) Int. Cl.
*H01L 27/32* (2006.01)
*H01L 51/56* (2006.01)
(Continued)

(52) U.S. Cl.
CPC .......... *H01L 27/322* (2013.01); *G06F 3/0412* (2013.01); *G06F 3/0443* (2019.05);
(Continued)

(58) Field of Classification Search
CPC . H01L 27/232; H01L 27/323; H01L 27/3276; H01L 51/56; G06F 3/0443; G06F 3/0412
(Continued)

(56) References Cited

U.S. PATENT DOCUMENTS

2010/0295807 A1* 11/2010 Xie .................. G06F 3/0414
345/173
2015/0346406 A1* 12/2015 Lian .................. G02B 5/23
252/586
(Continued)

FOREIGN PATENT DOCUMENTS

KR 10-2017-0106621 9/2017
KR 10-2018-0082688 7/2018
(Continued)

*Primary Examiner* — Prabodh M Dharia
(74) *Attorney, Agent, or Firm* — F. Chau & Associates, LLC

(57) ABSTRACT

A display device includes a base substrate having a main area, a sub-area, and a bending area. The main area includes pixels that each include a thin film transistor having a semiconductor layer, a gate electrode, a source electrode and a drain electrode. The display device includes a first insulating layer, a first conductive layer and a second insulating layer. The bending area includes a bending organic layer in a bending open portion. A second conductive layer is disposed on the second insulating layer and includes a source connection electrode. An encapsulation layer covers a light emitting element disposed on the second conductive layer for each of the pixels. A touch layer and a color filter layer are disposed on the encapsulation layer. The color filter layer includes a plurality of first color patterns overlapping the source connection electrode in the bending area that are separated from each other.

20 Claims, 29 Drawing Sheets

(51) Int. Cl.
  *G06F 3/041*  (2006.01)
  *G06F 3/044*  (2006.01)
  *H01L 51/00*  (2006.01)
(52) U.S. Cl.
  CPC ........ *H01L 27/323* (2013.01); *H01L 27/3276* (2013.01); *H01L 51/56* (2013.01); *G06F 2203/04102* (2013.01); *G06F 2203/04103* (2013.01); *G06F 2203/04111* (2013.01); *H01L 51/0097* (2013.01); *H01L 2227/323* (2013.01); *H01L 2251/5338* (2013.01)
(58) Field of Classification Search
  USPC ......................................................... 345/174
  See application file for complete search history.

(56) References Cited

U.S. PATENT DOCUMENTS

| 2016/0334685 | A1* | 11/2016 | Cao | G02F 1/136227 |
| 2018/0308903 | A1* | 10/2018 | Jeong | G06F 3/04164 |
| 2020/0168670 | A1* | 5/2020 | Kim | H01L 27/3262 |
| 2020/0209927 | A1* | 7/2020 | Ko | G06F 3/0412 |

FOREIGN PATENT DOCUMENTS

| KR | 10-2019-0018986 | 2/2019 |
| KR | 10-2019-0070909 | 6/2019 |
| KR | 10-2019-0073850 | 6/2019 |

\* cited by examiner

DISPLAY DEVICE AND METHOD OF MANUFACTURING THE SAME

This application claims priority under 35 § 119 to Korean Patent Application No. 10-2020-013045, filed on Feb. 4, 2020 in the Korean Intellectual Property Office, the disclosure of which is incorporated by reference in its entirety herein.

1. TECHNICAL FIELD

The present inventive concepts relate to a display device and a method of manufacturing the same, and more particularly to a display device including a touch member.

2. DISCUSSION OF RELATED ART

A display device for displaying an image to a user is applied to various electronic devices, such as smart phones, tablet PCs, digital cameras, notebook computers, navigators, and televisions. A display device includes a display panel for generating and displaying an image and various input devices.

Recently, in electronic devices, such as smart phones and tablet PCs, a touch panel recognizing a touch input is applied to the display device. The touch panel determines whether or not an input is performed, and calculates the corresponding position as touch input coordinates.

SUMMARY

An aspect of the present inventive concepts is to provide a display device in which bending characteristics are improved in a bending area.

Another aspect of the present inventive concepts is to provide a method of manufacturing a display device in which bending characteristics are improved in a bending area.

According to an embodiment of the present inventive concepts, a display device includes a base substrate having a main area, a sub-area, and a bending area disposed between the main area and the sub-area. The main area includes a plurality of pixels that each include a thin film transistor having a semiconductor layer, a gate electrode, a source electrode and a drain electrode. A first insulating layer is disposed on the semiconductor layer. A first conductive layer is disposed on the first insulating layer and includes the gate electrode of the thin film transistor. A second insulating layer is disposed on the first conductive layer. The bending area includes a bending organic layer disposed in a bending open portion that penetrates the first insulating layer and the second insulating layer. A second conductive layer is disposed on the second insulating layer and includes a source connection electrode electrically connected to the source electrode and the drain electrode of the thin fib transistor, and overlapping the bending organic layer. A light emitting element is disposed on the second conductive layer for each of the pixels. An encapsulation layer covers the light emitting element. A touch layer and a color filter layer are disposed on the encapsulation layer. The color filter layer includes a plurality of first color patterns overlapping the source connection electrode in the bending area. Adjacent first color patterns of the plurality of first color patterns are separated from each other and include a separation space therebetween.

According to an embodiment of the present inventive concepts, a method of manufacturing a display device includes forming a base substrate having a main area, a sub-area, and a bending area disposed between the main area and the sub-area. The main area includes a plurality of pixels that each include a thin film transistor having a semiconductor layer, a gate electrode, a source electrode and a drain electrode. A gate insulating layer is formed on the semiconductor layer. A first conductive layer including the gate electrode of the thin film transistor is formed on the gate insulating layer. An interlayer insulating layer is formed on the first conductive layer. A bending organic layer is formed in a bending open portion penetrating the gate insulating layer and the interlayer insulating layer in the bending area. A second conductive layer is formed on the interlayer insulating layer. The second conductive layer includes the source electrode and the drain electrode of the thin film transistor, and a source connection electrode overlapping the bending organic layer. A light emitting element is formed on the second conductive layer for each pixel of the plurality of pixels. An encapsulation layer is formed that covers the light emitting element. A plurality of first color patterns overlapping the source connection electrode is formed in the bending area. The plurality of first color patterns are separated from each other.

However, aspects of the present inventive concepts are not restricted to those set forth herein. The above and other aspects of the present inventive concepts will become more apparent one of ordinary skill in the art to which the present inventive concepts pertain by referencing the detailed description of embodiments given below.

BRIEF DESCRIPTION OF THE DRAWING

The above and other aspects and features of the present invention will become more apparent by describing in detail illustrative embodiments thereof with reference to the attached drawings, in which.

DETAILED DESCRIPTION OF ILLUSTRATIVE EMBODIMENTS

The present inventive concepts will now be described more fully hereinafter with reference to the accompanying drawings, in which preferred illustrative embodiments of the present inventive concepts are shown. The present inventive concepts may, however, be embodied in different forms and should not be construed as limited to the illustrative embodiments set forth herein. Rather, these illustrative embodiments are provided to convey the present inventive concepts to those skilled in the art. The same reference numbers indicate the same components throughout the specification. In the attached figures, the thickness of layers and regions is exaggerated for clarity.

It will also be understood that when a layer is referred to as being "on" another layer or substrate, it can be directly on the other layer or substrate, or intervening layers may also be present. In contrast, when an element is referred to as being "directly on" another element, there are no intervening elements present.

Although the terms "first", "second", etc. may be used herein to describe various elements, these elements should not be limited by these terms. These terms may be used to distinguish one element from another element. Thus, a first element discussed below may be termed a second element without departing from teachings of one or more illustrative embodiments. The description of an element as a "first" element may not require or imply the presence of a second element or other elements.

Hereinafter, illustrative embodiments will be described with reference to the accompanying drawings.

Hereinafter, illustrative embodiments of the present inventive concepts will be described with reference to the attached drawings.

Figure 1:
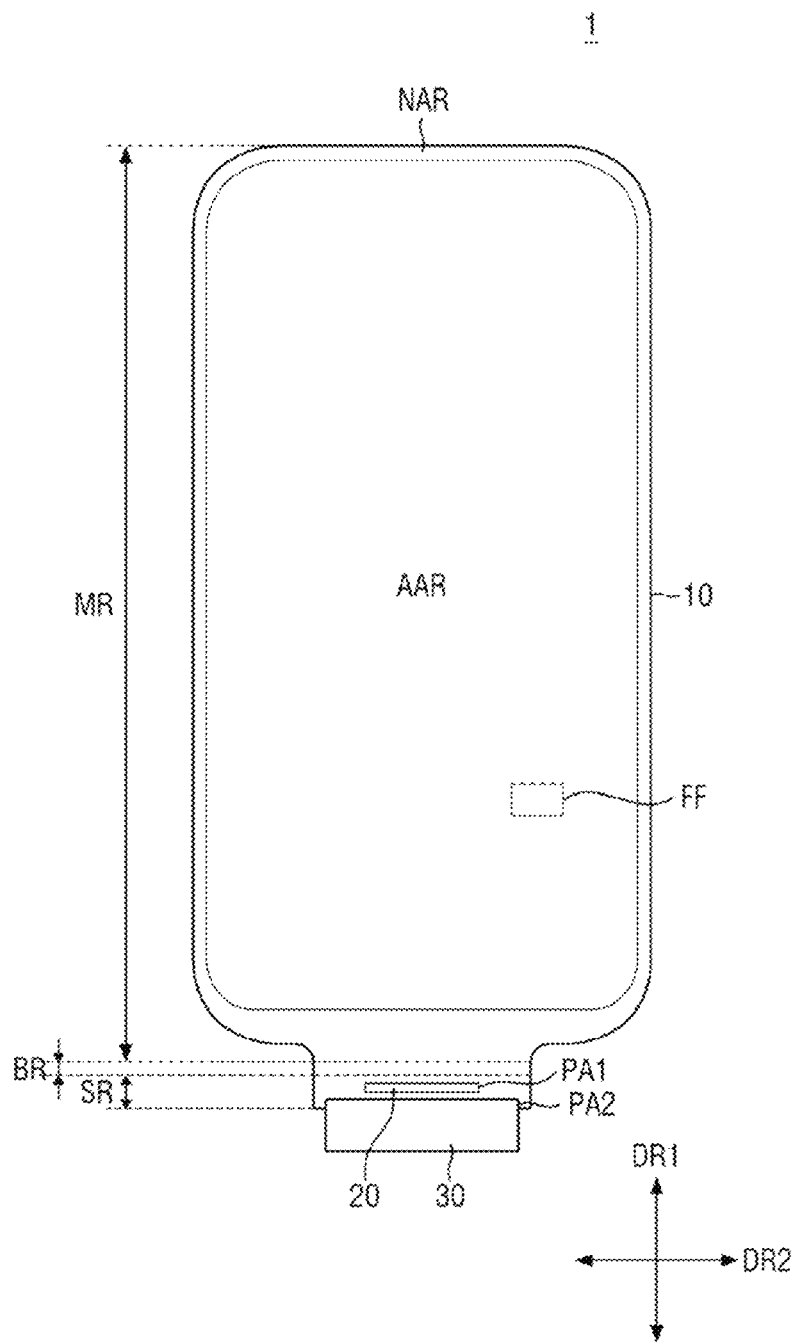
FIG. 1 is a plan view of a display device according to an illustrative embodiment of the present inventive concepts.
Figure 2:
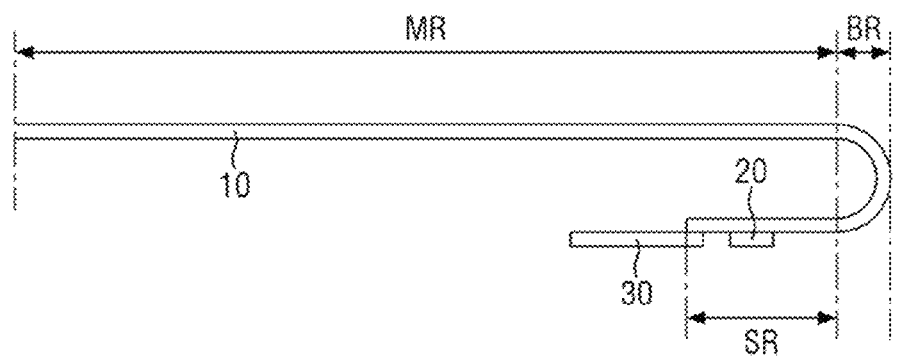
FIG. 2 is a partial cross-sectional view of a display device in a bent state according to an illustrative embodiment of the present inventive concepts.

FIG. 1 is a plan view of a display device according to an illustrative embodiment of the present inventive concepts, and FIG. 2 is a schematic cross-sectional view of a display device according to an illustrative embodiment of the present inventive concepts.

As shown in the illustrative embodiment of FIG. 1, a first direction DR1 and a second direction DR2 may cross each other in different directions. For example, in the plan view defined in the first and second directions DR1, DR2 as shown in FIG. 1, for convenience of description, the first direction DR1 is defined in a vertical direction and the second direction DR2 is defined in a horizontal direction. While in the illustrative embodiment of FIG. 1, the first direction DR1 and the second direction DR2 which cross each other are perpendicular to each other, illustrative embodiments of the present inventive concepts are not limited thereto. In the following illustrative embodiments, a first side of the first direction DR1 refers to an upward direction in the plan view and the opposite second side of the first direction DR1 refers to a downward direction in the plan view, a first side of the second direction DR2 refers to a right direction in the plan view, and the opposite second side of the second direction DR2 refers to a left direction in the plan view. However, the directions mentioned in the illustrative embodiments should be understood to refer to relative directions, and the embodiments are not limited to the aforementioned directions.

Referring to the illustrative embodiments of FIGS. 1 and 2, a display device 1 may be any electronic device that provides a display screen. For example, the display device 1 may include various large, medium or small-sized electronic device, including televisions, notebooks, monitors, billboards, and internets of things as well as portable electronic appliances such as mobile phones, smart phones, tablet personal computers (PCs), smart watches, watch phones, mobile communication terminals, electronic notebooks, electronic books, portable multimedia players (PMPs), navigators, and ultra mobile PCS (UMPs). However, illustrative embodiments of the present inventive concepts are not limited thereto.

The display device includes an active area AAR and a non-active area NAR. In an illustrative embodiment, a partial portion of the display device 1 displaying a screen is defined as a display area and a partial portion not displaying a screen is defined as a non-display area. An area where a touch input is detected is defined as a touch area. The display area and the touch area may be included in the active area AAR. In an illustrative embodiment, the display area and the touch area ay overlap each other (e.g., in a thickness direct on that is perpendicular to the first and second directions DR1 and DR2). For example, the active area AAR may be an area where as image is displayed and a touch input is also detected. In an illustrative embodiment, the shape of the active area AAR may be a rectangle or a rectangle having rounded corners. For example, as shown in the illustrative embodiment of FIG. 1, the shape of the active area AAR is a rectangle which has rounded corners and in which the sides extending in the first direction DR1 are relatively longer than the relatively shorter sides extending in the second direction DR2. However, illustrative embodiments of the present inventive concepts are not limited thereto, and the active area AAR may have various shapes such as a rectangle in which the second direction DR2 is longer than the first direction DR1, a square, other polygons, a circle, an ellipse, an irregular shape, etc.

The non-active area NAR is disposed around the active area AAR. The non-active area NAR may be a bezel area. For example, as shown in the illustrative embodiment of FIG. 1, the non-active area NAR may surround all sides of the active area AAR. For example, the non-active area NAR surrounds all four sides of the active area AAR in FIG. 1. However, illustrative embodiments of the present inventive concepts are not limited thereto. For example, in another illustrative embodiment, the active area AAR may extend to an edge of the display device 1 on at least one side, and the non-active area NAR may not be disposed around at least one side of the active area AAR. For example, the non-active area NAR may not be disposed around the upper side of the active area AAR or around the left and right sides of the active area AAR.

Signal lines or driving circuits for applying signals to the active area AAR (e.g., the display area or touch area) may be arranged in the non-active area NAR. The non-active area NAR may not include a display area. The non-active area NAR may also not include a touch area. However, illustrative embodiments of the present inventive concepts are not limited thereto, and in another illustrative embodiment, the non-active area NAR may include a portion of the touch area, and a sensing member such as a pressure sensor may be disposed in the corresponding area. In some illustrative embodiments, the active area AAR may be exactly the same area as the display area where a screen is displayed, and the non-active area NAR may be the same area as the non-display area where a screen is not displayed.

The display device 1 includes a display panel 10 that provides a display screen. Examples of the display panel may include an organic light emitting display panel, a micro LED display panel, a nano LED display panel, a quantum dot light emitting display panel, a liquid crystal display panel, a plasma display panel, a field emission display panel, an electrophoretic display panel, and an electrowetting display panel. However, illustrative embodiments of the present inventive concepts are not limited thereto. Hereinafter, a case where the display panel 10 is an organic light emitting display panel is illustrated for convenience of explanation. However, illustrative embodiments of the present inventive concepts are not limited thereto, and the present inventive concepts may be applied to other display panels in other illustrative embodiments.

The display panel 10 may include a plurality of pixels. In an illustrative embodiment, the plurality of pixels may be arranged in a matrix direction. In an illustrative embodiment, the shape of each pixel may be a rectangle or a square in a plan view (e.g., in a plane defined in the first direction DR1 and second direction DR2). However, illustrative embodiments of the present inventive concepts are not limited thereto, and each pixel may have a rhombus shape in which each side is inclined with respect to the first direction DR1 or various other shapes in other illustrative embodiments. Each pixel may include a light emitting area. Each light emitting area may have the same shape as the pixel or may have a different shape than the pixel. For example, when the pixel has a rectangular shape, the light emitting area of the corresponding pixel may have various shapes including a rectangle, a rhombus, a hexagon, an octagon, a circle, etc. Details of each pixel and each lien emitting area will be described later.

The display device 1 may further include a touch member that detects a touch input. In an illustrative embodiment, the touch member may be provided as a panel or a film that is separate from the display panel 10 and attached to the display panel 10 or may be provided in, the form of a touch layer inside the display panel 10. In the following illustrative embodiments, the touch member is provided in the form of a touch layer inside the display panel to be included in the display panel 10 for convenience of explanation. However, illustrative embodiments of the present inventive concepts are not limited thereto.

In an illustrative embodiment, the display panel 10 may include a flexible substrate including a flexible polymer material such as polyimide. Accordingly, the display panel 10 may be bent, warped, folded, rolled, etc.

The display panel 10 may include a bending area BR in which the panel is bent. The display panel 10 may be divided into a main area MR located at a first side of the bending area BR, and a sub-area SR located at the second side of the bending area BR, based on the bending area BR. For example, as shown in the illustrative embodiment of FIG. 1, an upper side (e.g., in the first direction DR1) of the bending area BR may include the main area MR and a lower side may include the sub-area SR.

The display area of the display panel 10 is disposed in the main area MR. In an illustrative embodiment, edges surrounding the display area and the entire bending area BR in the main area MR, and the entire sub-area SR may be non-display areas. However, illustrative embodiments of the present inventive concepts are not limited thereto, and the bending area BR and/or the sub-area SR may include at least one display area in other illustrative embodiments.

The main area MR may generally have a shape similar to the planar appearance of the display device 1. The main area MR may be a flat area located in a plane (e.g., a plane defined by the first direction DR1 and the second direction DR2). However, illustrative embodiments of the present inventive concepts are not limited thereto, and at least one of the remaining edges other than the edge connected to the bending area BR may be curved in the main area MR to form a curved surface or bend in the vertical direction.

In illustrative embodiments in which at least one of the remaining edges other than the edge (side) connected to the bending area BR may be curved or bent in the main area MR, the display area may also be disposed at the corresponding edge. However, illustrative embodiments of the present inventive concepts are not limited thereto, and the curved or bent edge may be a non-display area that does not display the screen, or the display area and the non-display area may be mixed in the corresponding portion.

The bending area BR may be connected to one side of the main area MR. For example, as shown in the illustrative embodiment of FIG. 1, the bending area BR may be connected through the lower short side of the main area MR. The width (e.g., length in the second direction DR2 of the bending area BR may be smaller than the width (e.g., length in the second direction DR2) of the main area MR. As shown in the illustrative embodiment of FIG. 1, the connection portion of the main area MR and the bending area BR may have an L-shaped cutting shape. However, illustrative embodiments of the present inventive concepts are not limited thereto.

In the bending area BR, the display panel 10 may be bent with curvature in a downward direction in the thickness direction of the display device 1. In an illustrative embodiment, the bending area BR may have a constant radius of curvature. However, illustrative embodiments of the present inventive concepts are not limited thereto and the bending area BR may have a different radius of curvature for each section in other illustrative embodiments. As shown in the illustrative embodiment of FIG. 2, when the display panel 10 is bent in the bending area BR, the surface of the display panel 10 may be reversed. For example, a portion of the front surface of the display panel 10 facing upward when the bending region BR is in an unbent state as shown in FIG. 1 may be changed to face outward through the bending area BR and then face downward and disposed adjacent a rear surface of the display panel 10 as shown in FIG. 2.

The sub-area SR extends from the bending area BR (e.g., in the first direction DR1). The sub-area SR may be disposed adjacent to the rear surface of the display panel 10 when the display panel 10 is bent as shown in FIG. 2 and may extend in a direction parallel to the main area MR immediately when the bending area BR is in an unbent state as shown in FIG. 1. The sub-area SR may overlap the main area MR in the thickness direction of the display panel 10 when the bending area BR is in a bent state. As shown in the illustrative embodiment of FIG. 1, the width (e.g., length in the second direction DR2) of the sub-area SR may be equal to the width of the bending area BR. However, illustrative embodiments of the present inventive concepts are not limited thereto.

As shown in the illustrative embodiment of FIG. 1, the sub-area SR may include a first pad area PA1 and a second pad area PA2 located farther from the bending area BR (e.g., in the first direction DR1) than the first pad area PA1. In an illustrative embodiment, a driving chip 20 may be disposed in the first pad area PA1 of the sub-area SR. The driving chip 20 may include an integrated circuit for driving the display panel 10. The integrated circuit may include an integrated circuit for image display by the display panel 10 and/or an integrated circuit for a touch unit. The integrated circuit for image display by the display panel 10 and the integrated circuit for the touch unit may be provided as separate chips, and may be provided to be integrated into one chip.

In an illustrative embodiment, the second pad area PA2 of the sub area SR of the display panel 10 may include a plurality of display signal line pads and a plurality of touch signal line pads. A driving substrate 30 may be connected to the second pad area PA2 of the sub-area SR of the display panel 10. In an illustrative embodiment, the driving substrate 30 may be a flexible printed circuit board or a film.

Figure 3:
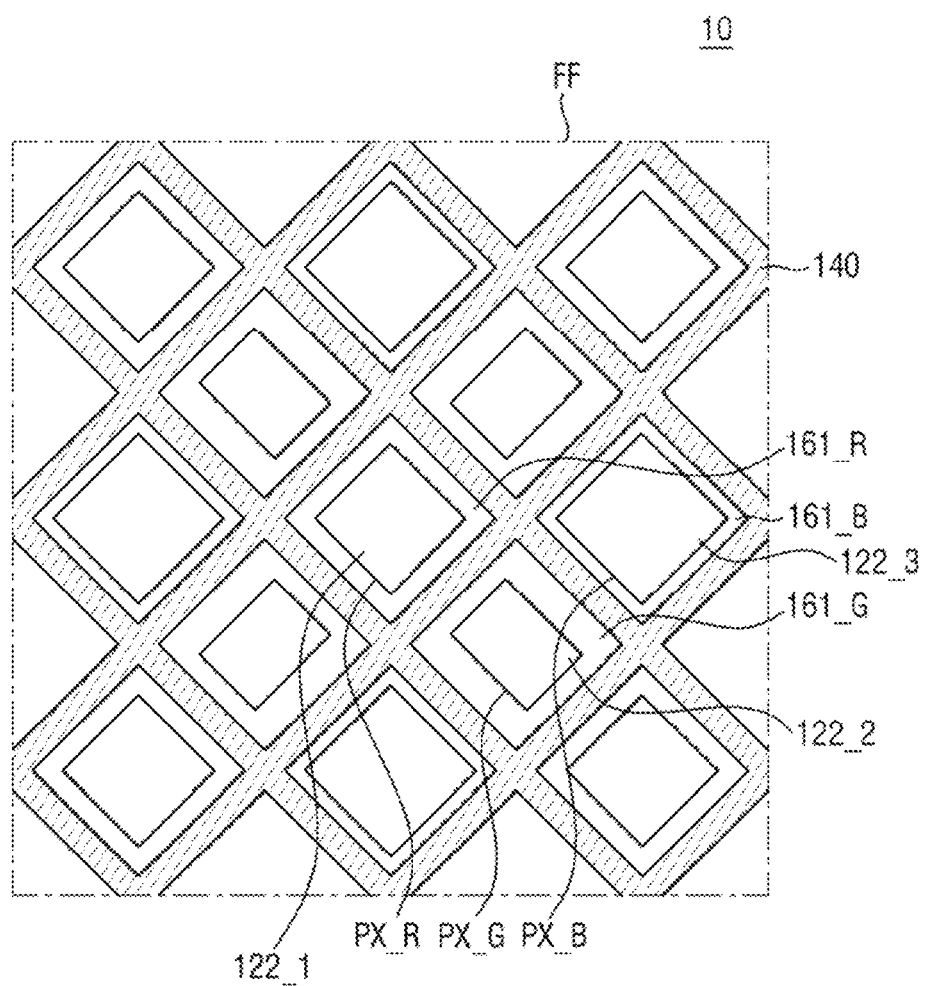
FIG. 3 is an enlarged plan view of portion FF of FIG. 1 according to an illustrative embodiment of the present inventive concepts.

FIG. 3 is a schematic enlarged plan view of the portion FF of FIG. 1 according to an illustrative embodiment of the present inventive concepts.

Referring to the illustrative embodiment of FIG. 3, the display device 1 includes a plurality of pixels arranged in a matrix shape. The plurality of pixels may be a plurality of color pixels. For example, in the illustrative embodiment shown in FIG. 3, the plurality of pixels include a red pixel PX_R, a green pixel PX_G, and a blue pixel PX_B. However, illustrative embodiments of the present inventive concepts are not limited thereto. For example, in another illustrative embodiment, the plurality of pixels may further include a white pixel. In another illustrative embodiment, cyan, magenta, and yellow pixels may be arranged instead of red, green, and blue pixels. Hereinafter, a case in which the display device 1 includes red, green, and blue pixels PX_R, PX_G, and PX_B will be described as an example for convenience of explanation.

The red, green, and blue pixels PX_R, PX_G, and PX_B may be alternately arranged. As shown in the illustrative embodiment of FIG. 3, each of the red, green, and blue pixels PX_R, PX_G, and PX_B may have a rectangular shape. The sizes of the pixels PX_R, PX_G, and PX_B may be different from each other. For example, the blue pixel PX_B may be larger than the red pixel PX_R, and the red pixel PX_R may be larger than the green pixel PX_G. However, the size order of the red, green, and blue pixels PX_R, PX_G, and PX_B is not limited thereto and the sizes of the red, green, and blue pixels may vary. In another illustrative embodiment, the sizes of at least two of the red, green, and blue pixels PX_R, PX_G, and PX_B may be the same.

Figure 6:
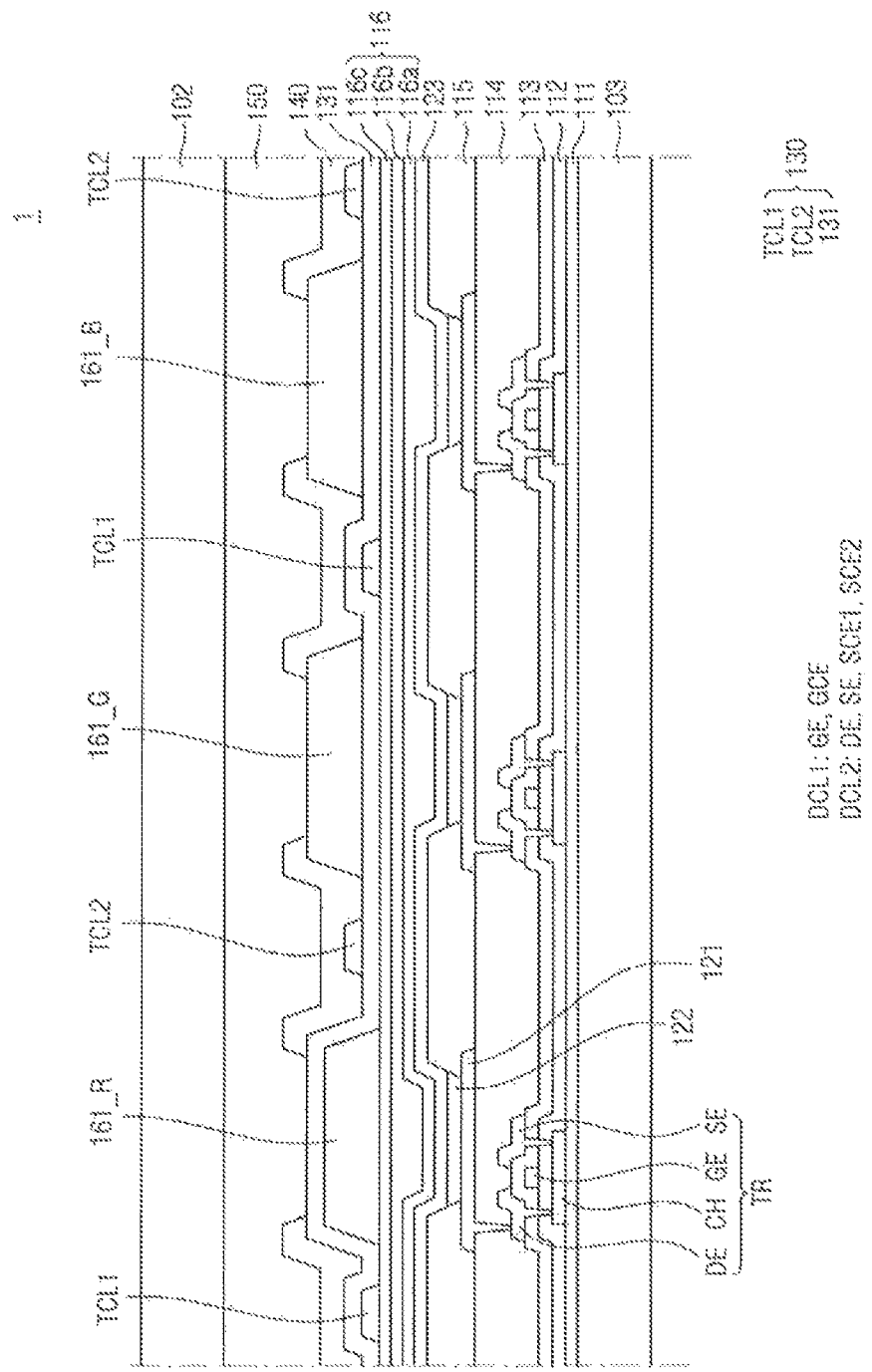
FIG. 6 is a cross-sectional view of a main portion off display device according to an illustrative embodiment of the present inventive concepts.

Each of the red, green, and blue pixels PX_R, PX_G, and PX_B includes an organic light emitting layer 122 (as shown in FIG. 6) and first, second and third color filters 161_R, 161_G, and 161_B arranged for each pixel. In an illustrative embodiment, the first color filter 161_R may be a red color filter, the second color filter 161_G may be a green color filter, and the third color filter 161_B may be a blue color filter. The red pixel PX_R may include a red organic light emitting layer 122_1 and the first color filter 161_R is red, the green pixel PX_G may include a green organic light emitting layer 122_2 and the second color filter 161_G is green, and the blue pixel PX_B may include a blue organic light emitting layer 122_3 and the third color filter 161_B is blue. However, illustrative embodiments of the present inventive concepts are not limited thereto. For example, in another embodiment, the red, green, and blue pixels PX_R, PX_G, and PX_B may each include a white organic light emitting layer and the first to third color filters 161_R, 161_G, 161_B are red, green and blue, respectively. The white organic light emitting layer may be formed by stacking two or more organic light emitting layers.

The red first color filter 161_R selectively transmits red light. For example, the wavelength of red light may be in a range of about 620 nm to about 750 nm. The green color filter selectively transmits green light. For example, the wavelength of green light may be about 495 nm to about 570 nm. The blue color filter selectively transmits blue light. For example, the wavelength of blue light may be in a range of about 450 nm to about 495 nm.

The first color filter 161_R may be disposed in the red pixel PX_R, the second color filter 161_G may be disposed in the green pixel PX_G, and the third color filter 161_B may be disposed in the blue pixel PX_B. The first to third color filters 161_R, 161_G, and 161_B having the same color may be arranged on each organic light emitting layer 122, thereby preventing color mixing in the pixel and increasing color reproducibility. Since the first to third color filters 161_R, 161_G, and 161_B absorb external light, the reflection of external light may be reduced even when a polarizing plate or the like is not additionally disposed.

In an illustrative embodiment, the shape of the first color filter 161_R, the second color filter 161_G, and the third color filter 16_B may be substantially the same as the shape of the above-described pixel. For example, as shown in the illustrative embodiment of FIG. 3, when the shape of the pixel is a rhombus, the shape of each color filter may also be a rhombus.

The black matrix 140 is disposed at the boundary of each pixel. As shown in the illustrative embodiment of FIG. 3, the black matrix 140 may be formed in a lattice shape to partition the pixels PX_R, PX_G, and PX_B.

Figure 4:
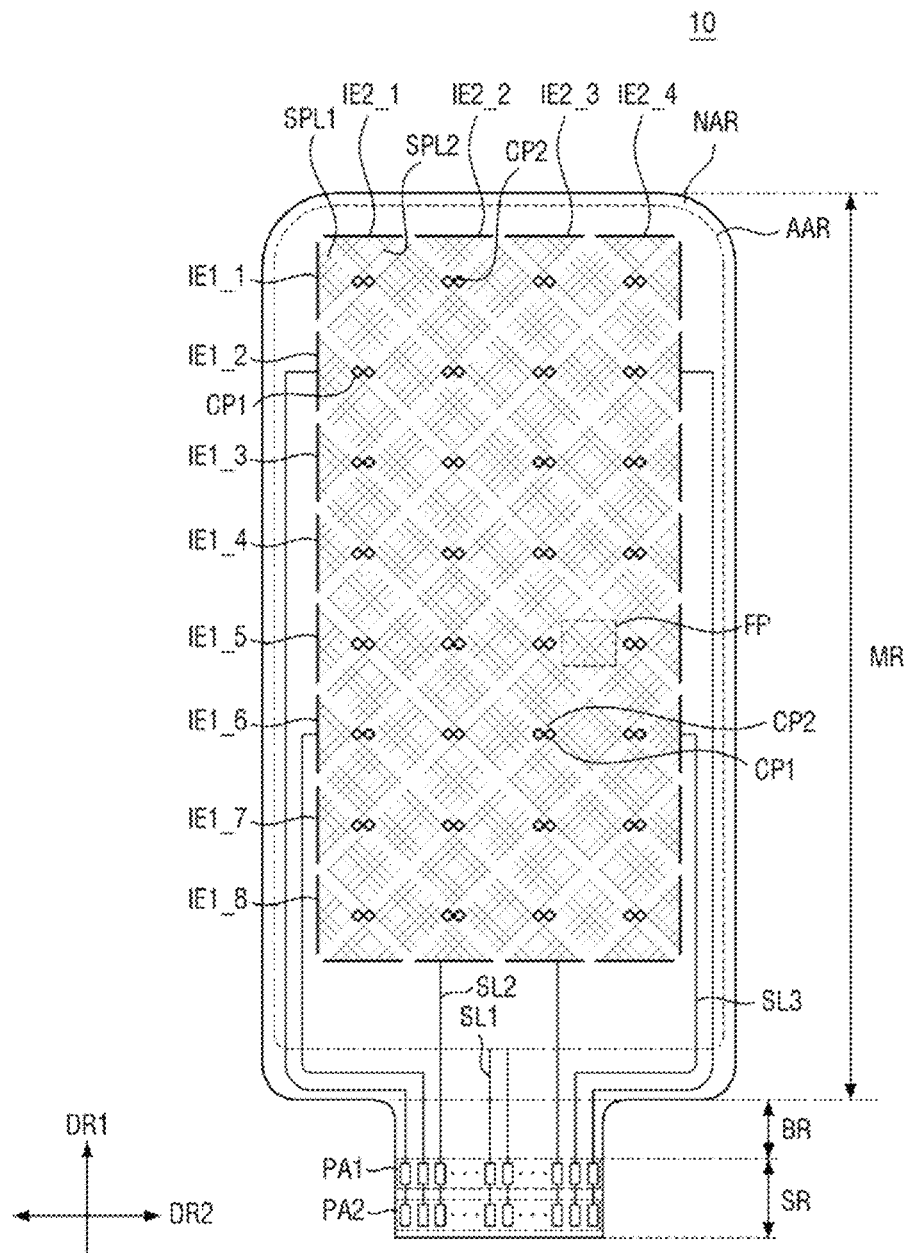
FIG. 4 is a plan view of a display panel including a touch sensing member of a display device according to an illustrative embodiment of the present inventive concepts.
Figure 5:
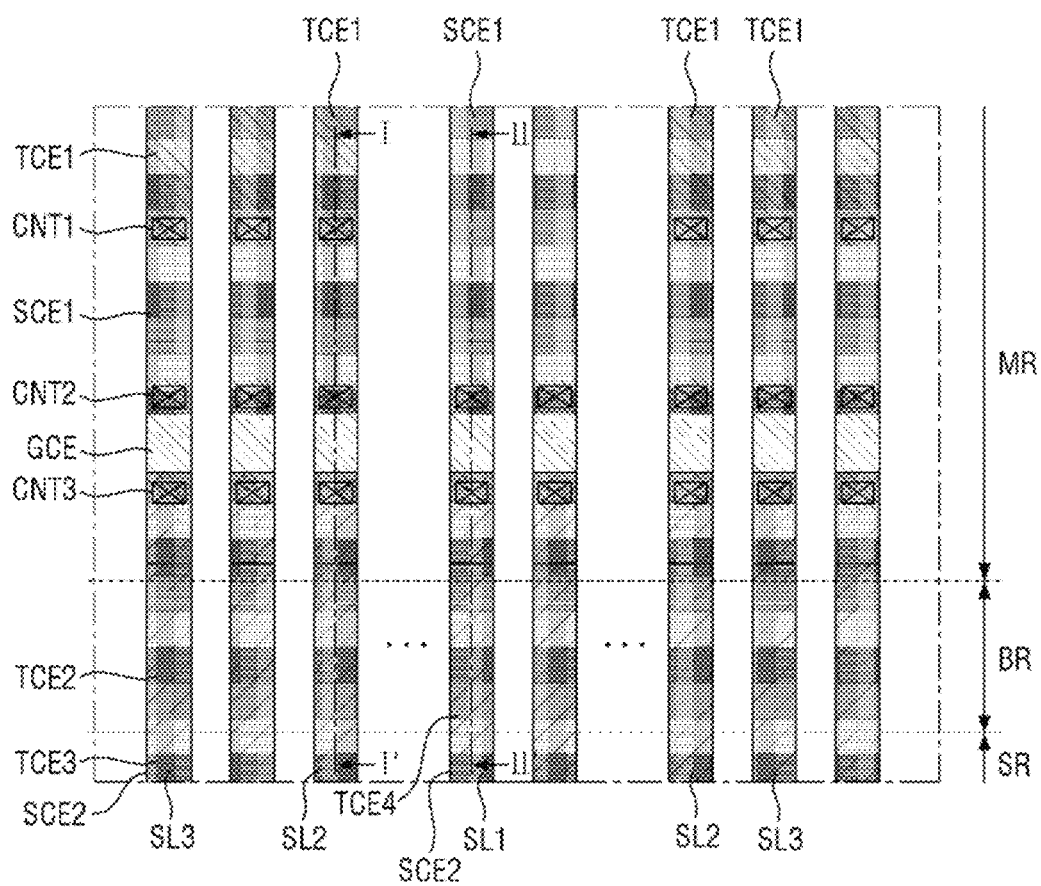
FIG. 5 is a plan view illustrating signal lines arranged in a main area, a bending area, and a sub-area according to an illustrative embodiment of the present inventive concepts.
Figure 7:
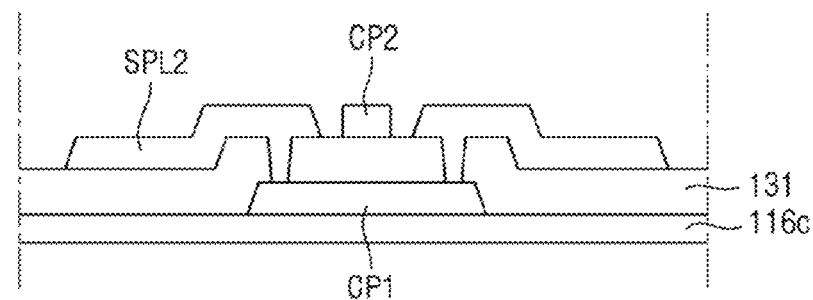
FIG. 7 is a schematic cross-sectional view of a touch sensing member according to an illustrative embodiment of the present inventive concepts.
Figure 8:
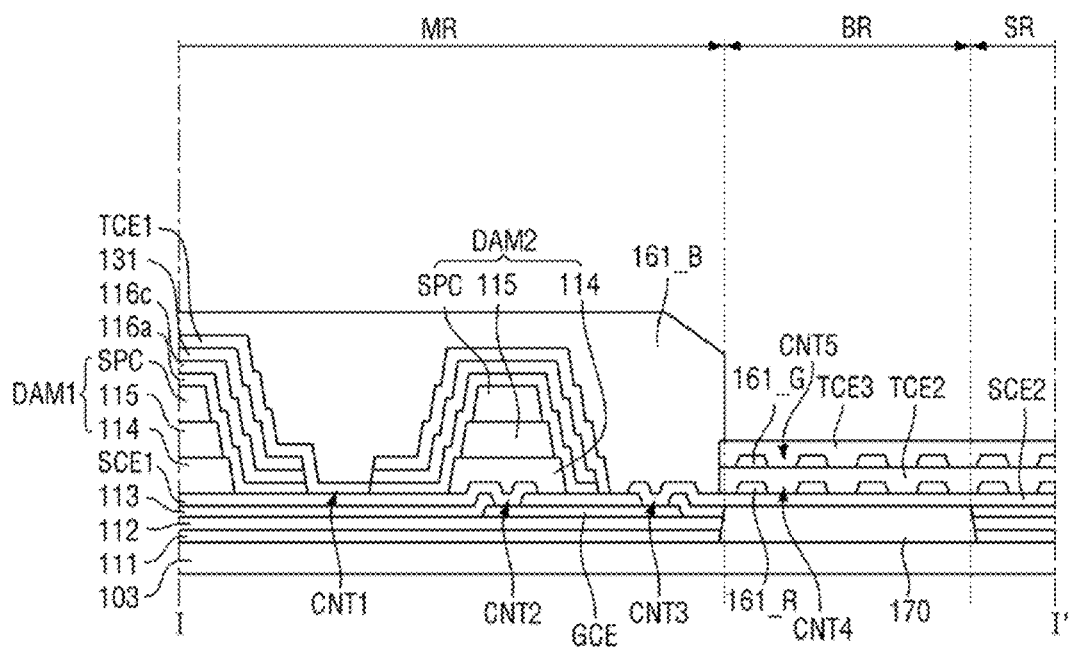
FIG. 8 is a cross-sectional view taken along the line I-I' of FIG. 5 according to an illustrative embodiment of the present inventive concepts.
Figure 9:
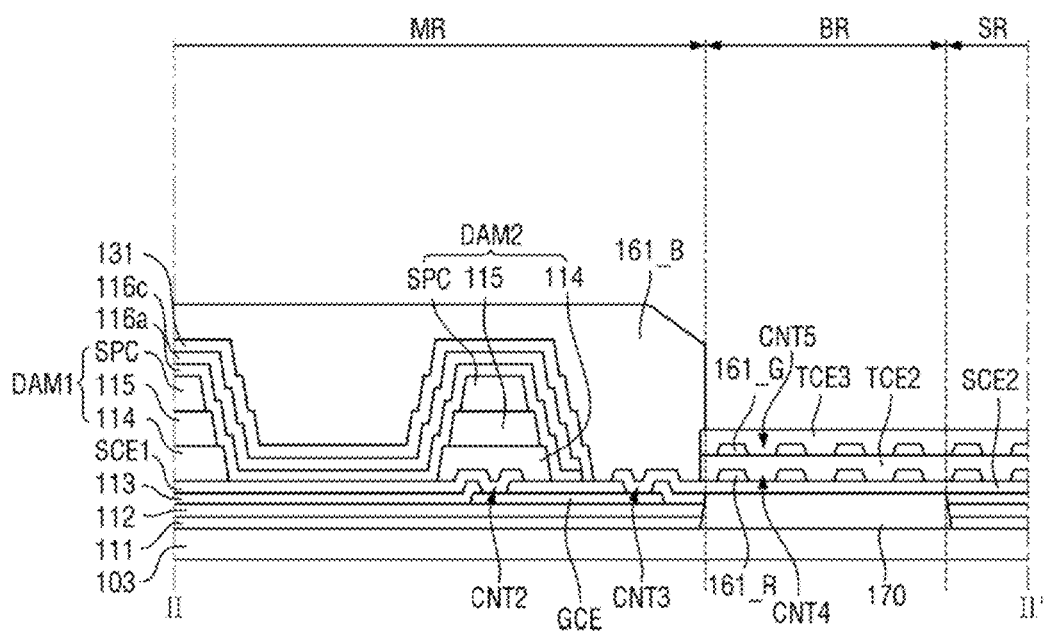
FIG. 9 is a cross-sectional view taken along the line II-II' of FIG. 5 according to an illustrative embodiment of the present inventive concepts.

FIG. 4 is a plan view of a display panel including a touch sensing member of a display device according to an illustrative embodiment of the present inventive concepts. FIG. 5 is a plan view illustrating signal lines arranged in a main area, a bending area, and a sub-area. FIG. 6 is a cross-sectional view of a main portion of a display device according to an illustrative embodiment of the present inventive concepts. FIG. 7 is a schematic cross-sectional view of a touch sensing member according to an illustrative embodiment of the present inventive concepts. FIG. 8 is a cross-sectional view taken along the line I-I' of FIG. 5 according to an illustrative embodiment of the present inventive concepts. FIG. 9 is a cross-sectional view taken along the line II-II' of FIG. 5 according to an illustrative embodiment of the present inventive concepts.

Referring to the illustrative embodiments of FIGS. 3 to 9, the display device 1 includes a base substrate 103, a plurality of conductive layers, an insulating layer, a light emitting element, an encapsulation layer, a touch sensing member, a plurality of color filters, and a black matrix, which are arranged on the base substrate 103.

As described above, the base substrate 103 may be a flexible substrate. For example, in an illustrative embodiment, the base substrate 103 may be one of a film substrate and a plastic substrate including a polymer organic material. For example, the base substrate 103 may include at least one compound selected front polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate. In addition, the base substrate 103 may include fiber glass reinforced plastic (FRP).

A buffer layer 111 is disposed on the base substrate 103. The buffer layer 111 functions to smooth (e.g., planarize) the surface of the base substrate 103 and prevent the penetration of moisture or external air. The buffer layer 111 may be an inorganic layer. The buffer layer 111 may be a single layer or a multilayer.

A plurality of thin film transistors TR is disposed on die buffer layer 111. In an illustrative embodiment, the plurality of thin film transistors TR may be driving thin film transistors. Each pixel may include one or more thin film transistors TR. As shown in the illustrative embodiment of FIG. 6, the thin film transistor TR may include a semiconductor layer CH, a gate electrode GE, a source electrode SE, and a drain electrode DE.

For example, the semiconductor layer CH is disposed on the buffer layer 111. In an illustrative embodiment, the semiconductor layer CH may include amorphous silicon, poly silicon, or an organic semiconductor. In another illustrative embodiment, the semiconductor layer CH may be an oxide semiconductor. The semiconductor layer CH may include a channel region, and a source region and a drain region which are disposed at both sides of the channel region and are doped with impurities.

A gate insulating layer 112 is disposed on the semiconductor layer CH. The gate insulating layer 112 may be an inorganic layer. The gate insulating layer 112 may be a single layer or a multilayer.

A first conductive layer DCL1 may be disposed on the gate insulating layer 112. The first conductive layer DCL1 may include a gate electrode GE and a gate connection electrode GCE. As shown in the illustrative embodiment of FIG. 8, the gate connection electrode GCE may be electrically connected to the thin film transistor of each pixel through a second contact hole CNT2 by a first source connection electrode SCE1 disposed in the main area MR that extends through the second contact hole CNT2 to contact the gate connection electrode GCE. The gate connection electrode GCE may also be connected to a second source connection electrode SCE2 spaced apart from the first source connection electrode SCE1 and disposed over a portion of the main area MR, the bending area BR, and the sub-area SR through a third contact hole CNT3.

In an illustrative embodiment, the first conductive layer DCL1 may be formed of a conductive metal material. For example, the first conductive layer DCL1 may include at least one compound selected from molybdenum (Mo), aluminum (Al), copper (Cu), and titanium (Ti). The first conductive layer DCL1 may be a single layer or a multilayer.

An interlayer insulating layer 113 is disposed on the first conductive layer DCL1. The interlayer insulating layer 113 may be an inorganic layer. The interlayer insulating layer 113 may be a single-layer or a multi-layer. The interlayer insulating layer 113 may include the second contact hole CNT2 and the third contact hole CNT3.

A second conductive layer DCL2 may be disposed on the interlayer insulating layer 113. As shown in the illustrative embodiments of FIGS. 6 and 8, the second conductive layer DCL2 may include a source electrode SE, a drain electrode DE, the first source connection electrode SCE1, and the second source connection electrode SCE2. In addition, the second conductive layer DCL2 may include a high-potential voltage line, a low potential voltage line, and a plurality of data lines. However, illustrative embodiments of the present inventive concepts are not limited thereto.

As shown in the illustrative embodiment of FIG. 6, the source electrode SE and the drain electrode DE may be electrically connected to the source region and the drain region of the semiconductor layer CH, respectively, through a contact hole penetrating the interlayer insulating layer 113 and the gate insulating layer 112.

The first source connection electrode SCE1 may be electrically connected to the thin film transistors of each pixel. For example, in an illustrative embodiment, the first source connection electrode SCE1 may be connected to a source electrode SE and a drain electrode DE of the thin film transistors. As shown in the illustrative embodiment of FIG. 8, the first source connection electrode SCE1 may be connected to a first touch connection electrode TCE1 of a second touch conductive layer TCL2 of the touch sensing member 130 (or touch layer) through a first contact hole CNT1, and may be connected to a gate connection electrode GCE through a second contact hole CNT2. The second source connection electrode SCE2 may be connected to the gate connection electrode GCE through a third contact hole CNT3. The third contact hole CNT3 may be located closer to the bending area BR than the second contact hole CNT2.

In an illustrative embodiment, the second conductive layer DCL2 is formed of conductive metal material. For example, the second conductive layer DCL2 may include at least one compound selected from aluminum (Al), copper (Cu), titanium (Ti), and molybdenum (Mo). The display device 1 may further include a storage capacitor and a switch thin film transistor disposed on the base substrate 103.

A protective layer 114 is disposed on the second conductive layer DCL2 and the interlayer insulating layer 113. The protective layer 114 is disposed to cover a pixel circuit unit including the thin film transistor TR. In an illustrative embodiment, the protective layer 114 may be a passivation layer or a planarization layer. The passivation layer may include at least one compound selected from $SiO_2$, SiNx, and the like, and the planarization layer may include at least one material selected from acrylic, polyimide and the like. In an illustrative embodiment, the passivation layer of the protective layer 114 may include both the passivation layer and the planarization layer. In this embodiment, the passivation layer may be a lower layer of the protective layer 114 that is disposed on the source electrode SE, the drain electrode DE, and the interlayer insulating layer 113, and the planarization layer may be an upper layer of the protective layer 114 that is disposed on the passivation layer.

A plurality of first electrodes 121 are disposed on the protective layer 114 and may be spaced apart from each other. The first electrode 121 may be a pixel electrode disposed for each pixel. For example, the first electrode 121 may be an anode electrode of an organic light emitting diode. As shown in the illustrative embodiment of FIG. 6, the first electrode 121 may be electrically connected to the drain electrode DE disposed on the base substrate 103 through a via hole penetrating the protective layer 114. However, illustrative embodiments of the present inventive concepts are not limited thereto and in other illustrative embodiments the first electrode 121 may be electrically connected to the source electrode SE disposed on the base substrate 103 through the via hole penetrating the protective layer 114.

In an illustrative embodiment, the first electrode 121 may include a material having a high work function. For example, the first electrode 121 may include at least one compound selected from indium tin oxide (ITO), indium zinc oxide (IZO), zinc oxide (ZnO), and indium oxide ($In_2O_3$). The above-exemplified conductive materials have a relatively high work function and transparent properties. In an illustrative embodiment in which the organic light emitting display device is a top emission type, the first electrode 121 may further include a reflective material such as at least one compound selected from silver (Ag), magnesium (Mg), aluminum (Al), platinum (Pt), lead (Pd), gold (Au), nickel (Ni), neodymium (Nd), iridium (Ir), chromium (Cr), lithium (Li), calcium (Ca), and mixtures thereof in addition to the above exemplified conductive material. Accordingly, the first electrode 121 may have a single layer structure which is made of the above-exemplified conductive materials and reflective materials, or may have a multilayer structure in which these materials are stacked.

A pixel defining layer 115 is disposed on the first electrode 121. The pixel defining layer 115 includes an opening that exposes at least a portion of the first electrode 121. For example, as shown in the illustrative embodiment of FIG. 6, the pixel defining layer 115 may be disposed on lateral edges of the first electrode 121 and the opening may be formed in a portion of the pixel defining layer 115 that overlaps a central portion of the first electrode 121. The pixel defining layer 115 may include an organic material or an inorganic material. For example, in an illustrative embodiment, the pixel defining layer 115 may include a material such as a photoresist, a polyimide resin, an acrylic resin, a silicone compound, or a polyacrylic resin. However, illustrative embodiments of the present inventive concepts are not limited thereto.

An organic light emitting layer 122 is disposed on the first electrode 121 in the opening of the pixel defining layer 115. A second electrode 123 is disposed on the organic light emitting layer 122. In an illustrative embodiment, the second electrode 123 may be a common electrode extending through a plurality of pixels. The second electrode 123 may be a cathode of the organic light emitting diode.

In an illustrative embodiment, the second electrode 123 may include a material having a low work function. For example, the second electrode 123 may include Li, Ca, LiF/Ca, LiF/Al, Al, Mg, Ag, Pt, Pd, Ni, Au Nd, Ir, Cr, BaF, Ba, a compound thereof, or a mixture thereof (for example, a mixture of Ag and Mg). The second electrode 123 may further include an auxiliary electrode. The auxiliary electrode may include a film formed by deposition of the above-described material, and a transparent metal oxide such as at least one compound selected from indium tin oxide (ITO), indium zinc oxide (IZO), zinc oxide (ZnO), indium tin zinc oxide (ITZO) and the like. The first electrode 121, the organic light emitting layer 122, and the second electrode 123 may form an organic light emitting diode.

In an illustrative embodiment, a hole injection layer and/or a hole transport layer may be disposed between the first electrode 121 and the organic light emitting layer 122, and an electron transport layer and/or an electron injection layer may be disposed between the organic light emitting layer and the second electrode 123.

An encapsulation layer 116 is disposed on the second electrode 123. In an illustrative embodiment, the encapsulation layer 116 includes at least one inorganic layer and at least one organic layer. The at least one inorganic layer and the at least one organic layer may be stacked on each other. For example, as shown in the illustrative embodiment of FIG. 6, the encapsulation layer 116 is a multilayer including a first encapsulation inorganic layer 116a, an encapsulation organic layer 116b, and a second encapsulation inorganic layer 116c, which are sequentially stacked. In this illustrative embodiment, the first encapsulation inorganic layer 116a and the second encapsulation inorganic layer 116c may include at least one compound selected from silicon oxide (SiOx), silicon nitride (SiNx), and silicon oxynitride (SiONx), and the encapsulation organic layer 116b may include at least one compound selected from epoxy, acrylate, and urethane acrylate.

As shown in the illustrative embodiment of FIG. 6, the first color filter 161_R. and the touch sensing member 130 may be disposed on the encapsulation layer 116. The first color filter 161_R may be disposed directly on the encapsulation layer 116. The encapsulation layer 116 and the touch sensing member 130 may be in direct contact with each other. For example, the touch sensing member 130 may be disposed directly on the encapsulation layer 116. As shown in the illustrative embodiment of FIG. 6, a first touch conductive layer TCL1 of the touch sensing member 130 may be disposed directly on the encapsulation layer 116.

Referring to the illustrative embodiments of FIGS. 4 and 6, the touch sensing member 130 (e.g., the touch layer) may include the first touch conductive layer TCL1, a first touch insulating layer 131 disposed on the first touch conductive layer TCL1, and a second touch insulating layer TCL2 disposed on the first touch insulating layer 131.

The first touch conductive layer TCM may include a first touch bridge electrode CP1 that electrically connects adjacent first sensing electrodes IE1_1 to IE1_8. The second touch conductive layer TCL2 may include a plurality of first sensing electrodes IE1_1 to IE1_8 and a plurality of second sensing electrodes IE2_1 to IE2_4, and may further include a second touch bridge electrode CP2 that electrically connects adjacent second sensing electrodes IE2_1 to IE2_4. The first touch conductive layer TCL1 may be disposed directly on the encapsulation layer 116.

The plurality of first sensing electrodes IE1_1 to may extend along the second direction DR2 and may be arranged along the first direction DR1. The plurality of second sensing electrodes IE2_1 to IE2_4 may extend along the first direction DR1 and may be arranged along the second direction DR2.

Each of the plurality of first sensing electrodes IE1_1 to IE1_8 may include a plurality of first sensing lines SPL1 arranged to have a mesh shape. The area partitioned by the plurality of first sensing lines SPL1 may overlap the first to third organic light emitting layers 122_1, 122_2, and 122_3 (refer to FIG. 3). Each of the plurality of second sensing electrodes IE2_1 to IE2_4 may include a plurality of second sensing lines SP2 arranged to have a mesh shape. The area partitioned by the plurality of second sensing lines SPL2 may also overlap the first to third organic light emitting layers 122_1, 122_2, and 122_3. In an illustrative embodiment, the area partitioned by the plurality of first sensing lines SPL1 and the area partitioned by the plurality of second sensing lines SPL2 may have a rhombus shape. The rhombus shape may include not only the rhombus shape but also a shape close to the rhombus shape which may deviate from a rhombus shape in consideration of the process and arrangement of the sensing lines, etc.

As shown in the illustrative embodiment of FIG. 7, the plurality of first sensing lines SPL1 are electrically insulated from the plurality of second sensing lines SPL2. In an illustrative embodiment, the plurality of first sensing lines SPL1 may be disposed on the same layer as the plurality of second sensing lines SPL2. In this illustrative embodiment, the plurality of first touch bridge electrodes CP1 and the plurality of second touch bridge electrodes CP2 are arranged in different layers front each other to be electrically insulated.

In some illustrative embodiments, electrodes including the first touch conductive layer TCL1 and the second touch conductive layer TCL2 may be opposite to each other.

In another illustrative embodiment, the first touch conductive layer TCL1 may include the plurality of first sensing electrodes IE1_1 to IE1_8 and the first touch bridge electrode CP1, and the second touch conductive layer TCL2 may include the plurality of second sensing electrode IE2_1 to IE2_4 and the second touch bridge electrode CP2.

In another illustrative embodiment, the first touch conductive layer TCL1 may include the plurality of second sensing electrodes IE2_1 to IE2_4 and the second touch bridge electrode CP2, and the second touch conductive layer TCL2 may include the plurality of first sensing electrode IE1_1 to IE1_8 and the first touch bridge electrode CP1.

The first touch conductive layer TCL1 may include a first touch bridge electrode CP1 that electrically connects adjacent first sensing, electrodes IE1_1 to IE1_8. Hereinafter, an illustrative embodiment in which the second touch conductive layer TCL2 includes a plurality of first sensing electrodes IE1_1 to IE1_8 and a plurality of second sensing electrodes IE2_1 to IE2_4 and further include a second touch bridge electrode CP2 that electrically connects adjacent second sensing electrodes IE2_1 to IE2_4 will be described for convenience of explanation.

The second touch conductive layer TCL2 further includes a first touch connection electrode TCE1 and a third touch connection electrode TCE3, and the first touch conductive layer TCL1 includes a second touch connection electrode TCE2.

As shown in the illustrative embodiment of FIG. 8, in the main area MR, the first touch connection electrode TCE1 may be connected to the source connection electrode SCE1 through the first contact hole CNT1 penetrating the first encapsulation inorganic layer 116a, the second encapsulation inorganic layer 116c, and the first touch insulating layer 131.

In the bending area BR and the sub-area SR, the second touch connection electrode TCE2 may overlap the second source connection electrode SCE2 in the thickness direction and may be electrically connected to the second source connection electrode SCE2. In the bending area BR and the sub-area SR, the third touch connection electrode TCE3 may overlap the second touch connection electrode TCE2 in the thickness direction and may be electrically connected to the second touch connection electrode TCE2.

The plurality of first sensing lines SPL1 and the plurality of second sensing lines SPL2 may include a conductive material. In an illustrative embodiment, the conductive material may include a low-resistance metal such as at least one compound selected from silver (Ag), aluminum (Al), chromium (Cr), and nickel (Ni), or may include a conductive nanomaterial such as silver nanowires, carbon nanotubes or the like.

Referring to the illustrative embodiment of FIG. 4, the display device 1 may be connected to the plurality of first sensing electrodes IE1_1 to IE1_3 and the plurality of second sensing electrodes IE2_1 to IE2_4, and may further include a second signal line SL2 and a third signal line SL3 passing through the first pad area PA1 and the second pad area PA2. The second signal line SL2 may be electrically connected to the plurality of second sensing electrodes IE2_1 to IE2_4 of the touch sensing member 130. The third signal line SL3 may be electrically connected to the plurality of first sensing electrodes IE1_1 to IE1_8 of the touch sensing member 130.

The second signal line SL2 may include a first touch connection electrode TCE1 electrically connected to the plurality of second sensing electrodes IE2_1 to IE2_4 of the touch sensing member 130, a first source connection electrode SCE1 electrically connected to the first touch connection electrode TCE1 through the first contact hole CNT1, a gate connection electrode GCE electrically connected to the first source connection electrode SCE1 through the second contact hole CNT2, a gate connection electrode GCE electrically connected to the first source connection electrode SCE1 through the second contact hole CNT2, a second source connection electrode SCE2 connected to the gate connection electrode GCE through the third contact hole CNT3, and second and third, touch connection electrodes TCE2 and TCE3 stacked on the second source connection electrode SCE2.

As shown in the illustrative embodiment of FIG. 5, the third signal line SL3 may include a first touch connection electrode TCE1 electrically connected to the first sensing electrodes IE1_1 to IE1_8 of the touch sensing member 130, a first source connection electrode SCE1 electrically connected to the first touch connection electrode TCE1 through the first contact hole CNT1, a gate connection electrode GCE electrically connected to the first source connection electrode SCE1 through the second contact hole CNT2, a gate connection electrode GCE electrically connected to the first source connection electrode SCE1 through the second contact hole CNT2, a second source connection electrode SCE2 connected to the gate connection electrode GCE through the third contact hole CNT3, and second and third touch connection electrodes TCE2 and TCE3 stacked on the second source connection electrode SCE2.

Further, as shown in the illustrative embodiment of FIG. 4, the display panel 10 is electrically connected to the thin film transistor of each pixel, and may further include a first signal line SL1 passing through the first pad area PA1 and the second pad area PA2. As shown in the illustrative embodiment of FIG. 5, the first signal line SL1 may include a first source connection electrode SCE1 electrically connected to the thin film transistor of each pixel, a gate connection electrode GCE electrically connected to the first source connection electrode SCE1 through the second contact hole CNT2, a second source connection electrode SCE2 electrically connected to the gate connection electrode GCE through the third contact hole CNT3, and second and third touch connection electrodes TCE2 and TCE3 stacked on the second source connection electrode SCE2.

As shown in the illustrative embodiment of FIG. 5, the first contact hole CNT1 is located farther from the bending area BR than the second contact hole CNT2 and the third contact hole CNT3, and the second contact hole CNT2 may be located further from the bending area BR3 than the third contact hole CNT3.

As shown in the illustrative embodiment of FIG. 6, the first touch conductive layer TCL1 may be disposed directly on the encapsulation layer 116. However, illustrative embodiments of the present inventive concepts are not limited thereto, and in another illustrative embodiment, an insulating layer having a single layer or a multilayer may be disposed between the encapsulation layer 116 and the first touch conductive layer TCL1 (e.g., in the thickness direction).

The first touch insulating layer 131 may be disposed on the first touch conductive layer TCL1.

In an illustrative embodiment, the first touch insulating layer 131 may include an inorganic material. For example, the inorganic material may include at least one material selected from the group consisting of silicon oxide (SiOx) silicon nitride (SiNx), and silicon oxynitride (SiONx). In another illustrative embodiment, the first touch insulating layer 131 may include an organic material. In this illustrative embodiment, the organic material may include at least one material selected from acrylic resin, methacryl resin, polyisoprene, vinyl resin, epoxy resin, urethane resin, cellulose resin, siloxane resin, polyimide resin, polyamide resin, and perylene resin.

The second touch conductive layer TCL2 may be disposed on the first touch insulating layer 131. The above-described touch electrode and touch bridge electrode of the second touch conductive layer TCL2 may overlap the black matrix 140 and the pixel defining layer 115. Thus, the visual recognition of an image by a user may be prevented in this region.

As shown in the illustrative embodiment of FIG. 6, the first color filter 161_R may be disposed directly on the encapsulation layer 116. In an illustrative embodiment which will be described in further detail later, the first color filter 161_R may be formed prior to the forming of the touch sensing member 130 and after the encapsulation layer 116 is formed.

The first touch conductive layer TCL1 may be formed on the encapsulation layer 116 exposed by the first color filter 161_R. The first touch insulating layer 131 may be disposed on the first color filter 161_R. However, since the touch bridge electrode of the first touch conductive layer TCL1 overlaps the black matrix 140 and the pixel defining layer 115, the first color filter 161_R may not overlap the touch bridge electrode of the first touch conductive layer TCL1. Similarly, since the touch bridge electrode of the first touch conductive layer TCL1 does not overlap the first color filter 161_R, the touch bridge electrode may be directly disposed on the encapsulation layer 116.

In contrast, the second color filter 161_G may be disposed on the first touch insulating layer 131. For example, as shown in the illustrative embodiment of FIG. 6, the second color filter 161_G may be disposed directly on the first touch insulating layer 131. Therefore, the second color filter 161_G may be disposed on a different layer from the first color filter 161_R. In an illustrative embodiment, the second color filter 161_G may be formed after forming the first touch conductive layer TCL1 and the first touch insulating layer 131 of the touch sensing member 130.

The second touch conductive layer TCL2 may be disposed on the first touch insulating layer 131. For example, as shown in the illustrative embodiment of FIG. 6, the second touch conductive layer TCL2 may be formed on the first touch insulating layer 131 and then patterned. Since the touch bridge electrode and the touch electrodes of the second touch conductive layer TCL2 overlap the black matrix 140 and the pixel defining layer 115, the second color filter 161_G and the first color filter 161_R may not overlap the touch bridge electrode and the touch electrodes of the second touch conductive layer TCL2. In an illustrative embodiment, the touch bridge electrode and the touch electrodes of the second touch conductive layer TCL2 may be directly disposed on the first touch insulating layer 131.

Referring to the illustrative embodiments of FIGS. 8 and 9, the protective layer 114 and the pixel defining layer 115 may constitute first and second dams DAM1 and DAM2 together with a dam auxiliary layer SPC. The first dam DAM1 and the second dam DAM2 may have a stacked structure in, which the protective layer 114, the pixel defining layer 115, and the dam auxiliary layer SPC are stacked consecutively and overlap each other.

As shown in the illustrative embodiments of FIGS. 8-9, the first dam DAM1 and the second dam DAM2 may be spaced apart from each other. The second dam DAM2 may be located closer to the bending area BR than the first dam DAM1. Each of the first dam DAM1 and the second dam DAM2 may prevent the encapsulation organic layer 116b of the encapsulation layer 116 from overflowing into the bending area BR.

The first dam DAM1 may overlap (e.g., in a thickness direction of the base substrate 10) the first source connection electrode SCE1, and the second dam DAM2 may overlap the gate connection electrode GCE and the first source connection electrode SCE1 and overlap the second contact hole CNT2.

The first contact hole CNT1 penetrating through the first touch insulating layer 131, the first encapsulation inorganic layer 116a, and the second encapsulation inorganic layer 116c may be located between the first dam DAM1 and the second dam DAM2.

As shown in the illustrative embodiments of FIGS. 8 and 9, the first encapsulation inorganic layer 116a and the second encapsulation inorganic layer 116c may be sequentially stacked on the first dam DAM1 and the second dam DAM2. The first encapsulation inorganic layer 116a and the second encapsulation inorganic layer may directly contact with each other in these regions. The first encapsulation inorganic layer 116a may directly contact the first dam DAM1 and the second dam DAM2.

The first encapsulation inorganic layer 116a and the second encapsulation inorganic layer 116c may include a first contact hole CNT1. The first encapsulation inorganic layer 116a may directly contact the first source connection electrode SCE1.

As shown in the illustrative embodiments of FIGS. 5, 8, and 9, the first touch connection electrode TCE1 of the second signal line SL2 and the first touch connection electrode TCE1 of the third signal line SL3 may be disposed on the second encapsulation inorganic layer 116c and may directly contact the upper surface of the second encapsulation inorganic layer 116c. The first touch connection electrode TCE1 may be electrically connected to the first source connection electrode SCE through the first contact hole CNT1.

The buffer layer 111, the gate insulating layer 112, and the interlayer insulating layer 113 may include a bending open portion in the bending area BR which is an opening that exposes the upper surface of the base substrate 103.

A bending organic layer 170 may be disposed in the bending open portion. In an illustrative embodiment, the bending organic layer 170 may include an organic insulating material. The organic insulating material of the bending organic layer 170 may include at least one of the above-described materials of the protective layer 114.

The bending organic layer 170 may be formed in the bending open portion to planarize an electrode to prevent a step from being formed on the second source connection electrode SCE2 disposed thereon. Further, the bending organic layer 170 may include an organic material to prevent bending stress from occurring when the display device 1 is bent, thereby securing bending flexibility of the display device 1.

The bending organic layer 170 may directly contact the lateral side surfaces of the buffer layer 111, the gate insulating layer 112, and the interlayer insulating layer 113 which form the bending open portion. A lower surface of the bending organic layer 170 may directly contact an upper surface of the base substrate 103. The second source connection electrode SCE2 may be electrically connected to the gate connection electrode GCE through the third contact hole CNT3. The second source connection electrode SCE2 may be disposed over a portion of the main area MR, the bending region BR, and the sub-area SR. The second source connection electrode SCE2 may be in direct contact with the bending organic layer 170. For example, as shown in the illustrative embodiment of FIG. 8, a lower surface of the second source connection electrode SCE2 may directly contact an upper surface of the bending organic layer 170. Therefore, the first source connection electrode SCE1 and the second source connection electrode SCE2 may form a source connection electrode that is electrically connected to a source electrode SE and drain electrode DE of the thin film transistor and overlaps the bending organic layer 170.

As shown in the illustrative embodiments of FIGS. 8-9, the first color filter 161_R may include a plurality of first color patterns separated from each other in the bending area BR and the sub area SR. The plurality of first color patterns of the first color filter 161_R may be disposed directly on the second source connection electrode SCE2. For example, as shown in the illustrative embodiments of FIGS. 8-9, a lower surface of the plurality of first color patterns of the first color filter 161_R may directly contact an upper surface of the second source connection electrode SCE2.

The second touch connection electrode TCE2 may be disposed on the plurality of first color patterns of the first color filter 161_R separated from each other and the second source connection electrode SCE2. For example, as shown in the illustrative embodiments of FIGS. 8-9, a lower surface of the second touch connection electrode TCE2 may directly contact upper and lateral side surfaces of the plurality of first color patterns of the first color filter 161_R and an upper surface of the second source connection electrode SCE2. The second touch connection electrode TCE2 may overlap the plurality of first color patterns separated from each other and the second source connection electrode SCE2 (e.g., in the thickness direction of the base substrate 103). The second touch connection electrode TCE2 may be connected to the second source connection electrode SCE2 through a separation space disposed between adjacent first color patterns of the first color filter 161_R.

As shown in the illustrative embodiments of FIGS. 8-9, the second color filter 161_G may include a plurality of second color patterns separated from each other in the bending area BR and the sub-area SR. The plurality of second color patterns of the second color filter 161_G may be disposed directly on the second touch connection electrode TCE2. For example, as shown in the illustrative embodiments of FIGS. 8-9, a lower surface of the plurality of second color patterns of the second color filter 161_G may directly contact an upper surface of the second touch connection electrode TCE2. The third touch connection electrode TCE3 may overlap the second color patterns separated from each other and the second touch connection electrode TCE2 (e.g., in the thickness direction of the base substrate 103). The third touch connection electrode TCE3 may be connected to the second touch connection electrode TCE2 through a separation space between the adjacent second color patterns. A lower surface of the third touch connection electrode TCE3 may be directly contact upper surfaces and lateral side surfaces of the second color patterns of the second color filter 161_G.

The separation spaces of the first color patterns of the first color filter 161_R and the separation spaces of the second color patterns of the second color filter 161_G may overlap each other (e.g., in the thickness direction of the base substrate 103). The first color patterns of the first color filter 161_R and the second color patterns of the second color filter 161_G may overlap each other (e.g., in the thickness direction of the base substrate 103).

According to an illustrative embodiment, the first color pattern and the second color pattern are disposed in the bending area BR, thereby improving the bending characteristics of the display device 1.

Furthermore, when the display device 1 is bent in the bending area BR, the second source connection electrode SCE2 may be disconnected. In an illustrative embodiment, the second touch connection electrode TCE2 and the third touch connection electrode TCE3, which are electrically connected to the second source connection electrode SCE2, are further disposed in the bending area BR, thereby reducing the possibility of the disconnection of the first to third signal lines SL1, SL2, and SL3.

As shown in the illustrative embodiment of FIG. 8, in the main area MR, the third color filter 161_B may be disposed on the second touch conductive layer TCL2, such as the first touch connection electrode TCE1. In the main area MR, the third color filter 161_B may overlap the second touch conductive layer TCL2 (e.g., the first touch connection electrode TCE1) and may directly contact the third color filter 161_B. The third color filter 161_B may be disposed at the boundary between the main area MR and the bending area BR. However, in an illustrative embodiment, a partial portion of the third color filter 161_B may be disposed in the bending area BR.

As shown in the illustrative embodiment of FIG. 6, the black matrix 140 is disposed on the plurality of color filters in the main area MR. The black matrix 140 is disposed along a boundary of the pixel and includes an opening that exposes the pixel. The black matrix 140 may have a lattice shape connected along the boundary of the pixel. The underlying organic light emitting layer 122 may overlap the opening of the black matrix 140.

The black matrix 140 may directly contact the first touch insulating layer 131, the second touch conductive layer TCL2, the second color filter 161_G, and the third color filter 161_B in the main area MR. For example, as shown in the illustrative embodiment of FIG. 6, a lower surface of the black matrix 140 may directly contact upper surfaces of the first touch insulating layer 131 and upper and lateral side surfaces of the second touch conductive layer TCL2, the second filter 161_G and the third color filter 161_B in the main area MR.

In an illustrative embodiment, the black matrix 140 may include a light absorbing material or a light reflecting material. For example, the black matrix 140 may include a resin colored in black or a reflective metal such as chromium (Cr).

As shown in the illustrative embodiment of FIG. 6, a window 102 may be disposed on the black matrix 140. In an illustrative embodiment, the window 102 includes a flexible material, and may serve to cover the underlying configuration of the display device 1 as a whole. In an illustrative embodiment, the window 102 and the display panel 10 may be coupled to each other through an inter-module adhesive layer. However, illustrative embodiments of the present inventive concepts are not limited thereto.

As described above, according to an illustrative embodiment, the first color patterns of the third color filter 161_R and the second color patterns of the second color filter 161_G are disposed in the bending area BR, thereby improving the bending characteristics of the display device 1.

Furthermore, when the display device 1 is bent in the bending area BR, the second source connection electrode SCE2 may be disconnected. In an illustrative embodiment, the second touch connection electrode ICE2 and the third touch connection electrode TCE3, which are electrically connected to the second source connection electrode SCE2, are further disposed in the bending area BR thereby reducing the possibility of disconnection of signal lines SL1, SL2, and SL3 in the bending area BR.

Hereinafter, a method of manufacturing the aforementioned display device 1 will be described. In the following illustrative embodiments, the same elements as shown in the above-described embodiments are referred to by the same reference numerals, and a duplicative description thereof will be omitted or simplified for convenience of explanation.

Figure 10:
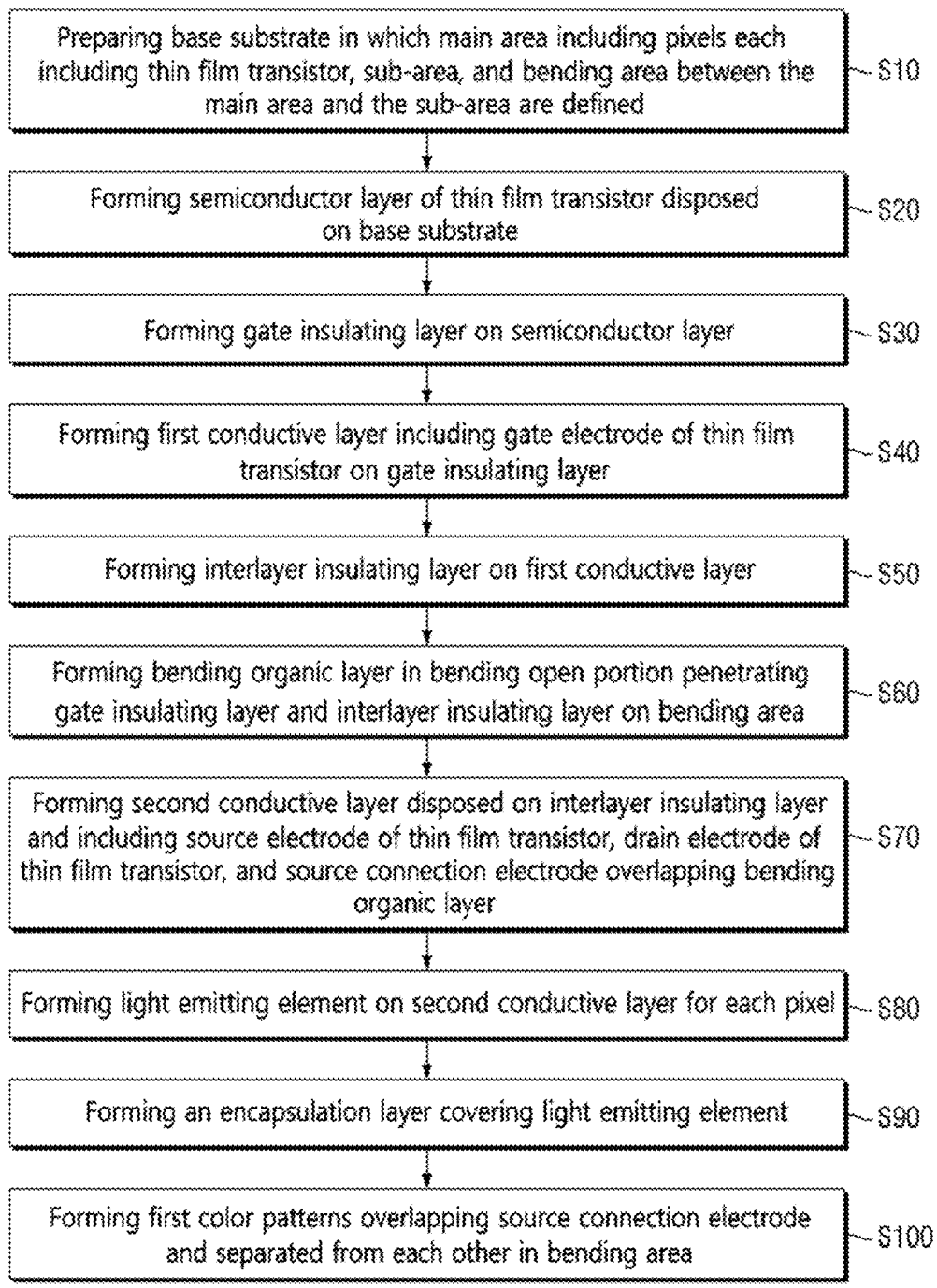
FIG. 10 is a flowchart of a method of manufacturing a display device according to an illustrative embodiment of the present inventive concepts.

FIG. 10 is a flowchart of a method of manufacturing a display device according to an illustrative embodiment of the present inventive concepts, and FIGS. 11 to 16 are cross-sectional views illustrating the processes in a method of manufacturing a display device according to illustrative embodiments of the present inventive concepts.

Figure 11:
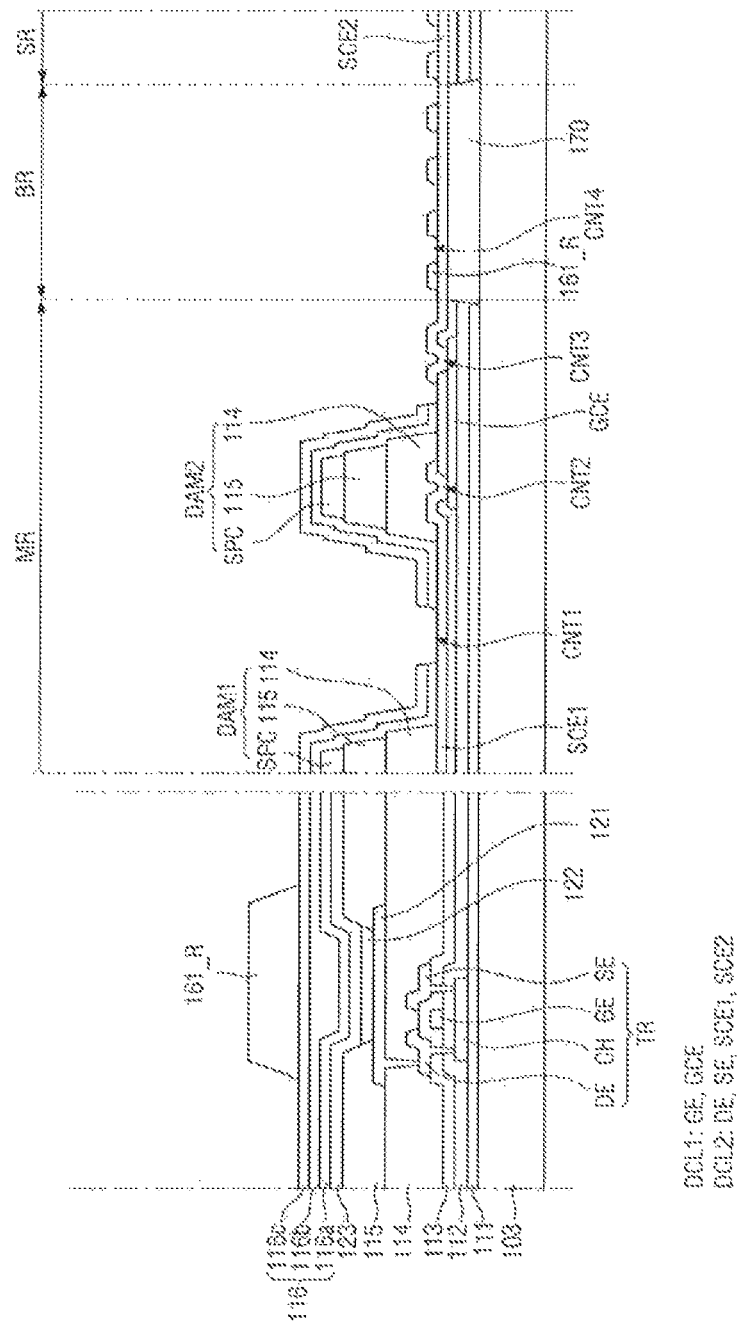
FIGS. 11 to 16 are cross-sectional views illustrating processes of a method of manufacturing a display device according to an illustrative embodiment of the present inventive concepts.

Referring to the illustrative embodiments of FIGS. 10 and 11, the method of manufacturing a display device includes in block S10 forming, a base substrate 103 having a main area MR including a plurality of pixels each including a thin film transistor TR, a sub-area SR, and a bending area BR disposed between the main area MR and the sub-area SR are defined. In block S20, a semiconductor layer CH of the thin film transistor TR is formed on the base substrate 103. In block S30, a gate insulating layer 112 is formed on the semiconductor layer CH. In block S40, a first conductive layer DCL1 including a gate electrode GE of the thin film transistor TR is thrilled on the gate insulating layer 112. In block S50, an interlayer insulating layer 113 is formed on the first conductive layer DCL1. In block S60, a bending organic layer is formed in a bending open portion penetrating the gate insulating layer 112 and the interlayer insulating layer 113 in the bending area BR. In block S70, a second conductive layer DCL2 is formed on the interlayer insulating layer 113 and includes a source electrode SE of the thin film transistor TR, a drain electrode DE of the thin film transistor TR, and a second source connection electrode SCE2 overlapping the bending organic layer. In block S80, light emitting elements which include a first electrode 121, an organic light emitting layer 122, and a second electrode 123 are formed on the second conductive layer DCL2 for each pixel. In block S90, an encapsulation layer 116 is formed to cover the light emitting element.

As described above with reference to the illustrative embodiments of FIGS. 8 and 9, the first conductive layer DCL1 may further include a gate connection electrode GCE, and the second conductive layer DCL2 includes a first source connection electrode SCE1 and a second source connection electrode SCE2. For example, in an illustrative embodiment, the gate electrode GE and the gate connection electrode GCE of the first conductive layer DCL1 may be simultaneously formed and include the same material, and the source electrode SE, the drain electrode DE, the first source connection electrode SCE1, and the second source connection electrode SCE2 of the second conductive layer DCL2 may be simultaneously formed and include the same material.

After the encapsulation layer is formed, the first color filter 161_R may be formed in the red pixel (PX_R of FIG. 3) on the encapsulation layer 116 and may be formed on the second source connection electrode SCE2 in the bending area BR. The first color filter 161_R formed on the second source connection electrode SCE2 on the bending area BR may include a plurality of first color patterns separated from each other.

In the main area MR, the first touch conductive layer TCL1 is formed on the encapsulation layer 116 exposed by the first color filter 161_R. In the bending area BR and the sub-area SR, the first touch conductive layer TCL1 is formed on the plurality of first color patterns of the first color filter 161_R and the second source connection electrode SCE2 that are separated from each other. The touch conductive layer TCL1 may include a first touch bridge electrode CP1 disposed in the main area MR and a second touch connection electrode TCE2 disposed in the bending area BR and the sub-area SR.

Figure 12:
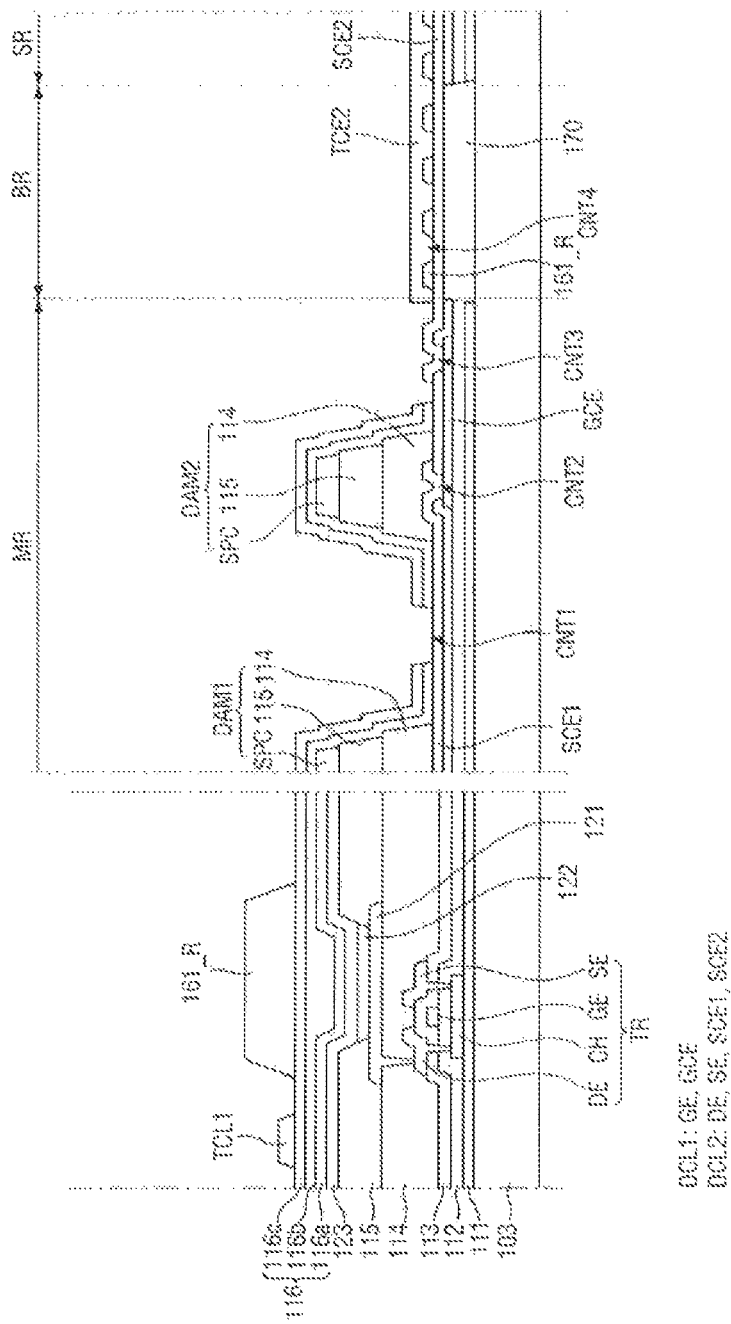

Referring to the illustrative embodiments of FIGS. 10 and 12, the second touch connection electrode TCE2 may be formed on the plurality of first color patterns of the first color filter 161_R and connected to the second source connection electrode SCE2 through a separation space disposed between the adjacent first color patterns. The second touch connection electrode TCE2 may be in direct contact with the upper surface and lateral side surfaces of the first color pattern of the first color filter 161_R.

Figure 13:
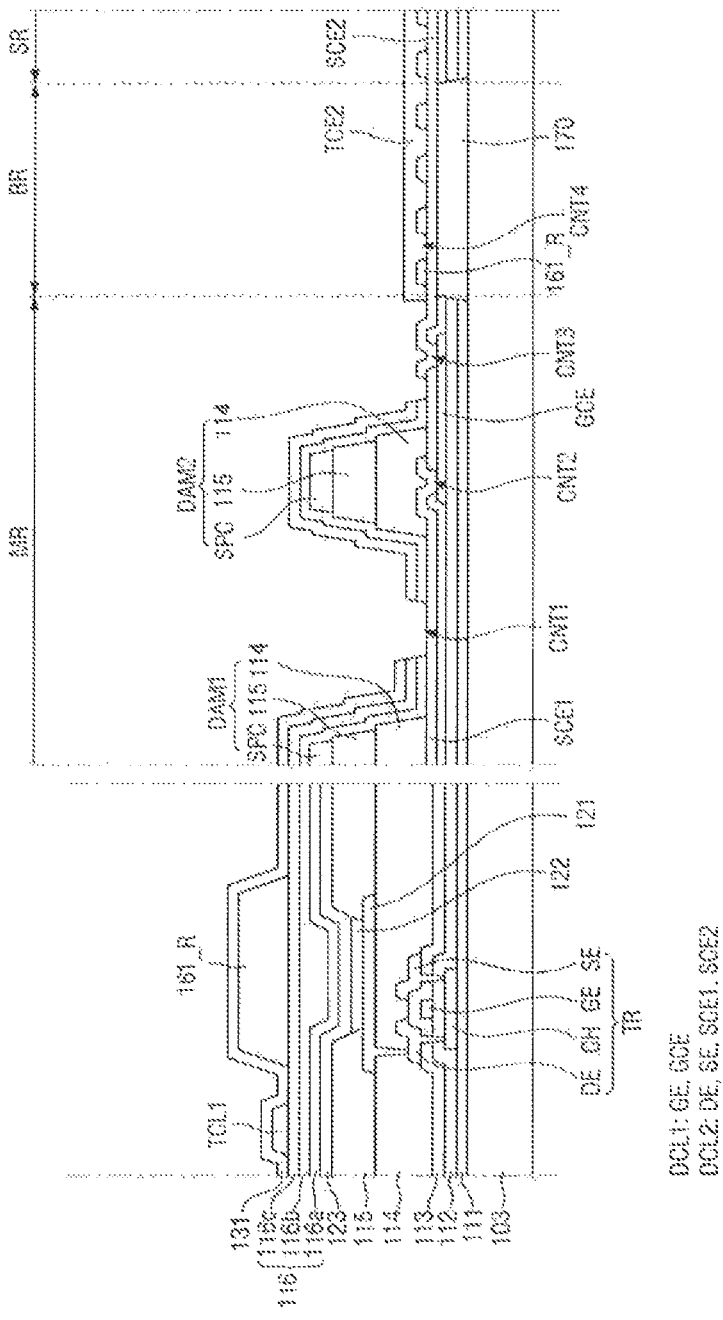

Referring to the illustrative embodiments of FIGS. 10 and 13, a first touch insulating layer 131 is formed on the first touch conductive layer TCL1. In the main area MR, the first touch insulating layer 131 may directly cover the first touch conductive layer TCL1 and the first color filter 161_R. The first touch insulating layer 131 may not be disposed in the bending area BR and the sub-area SR.

Figure 14:
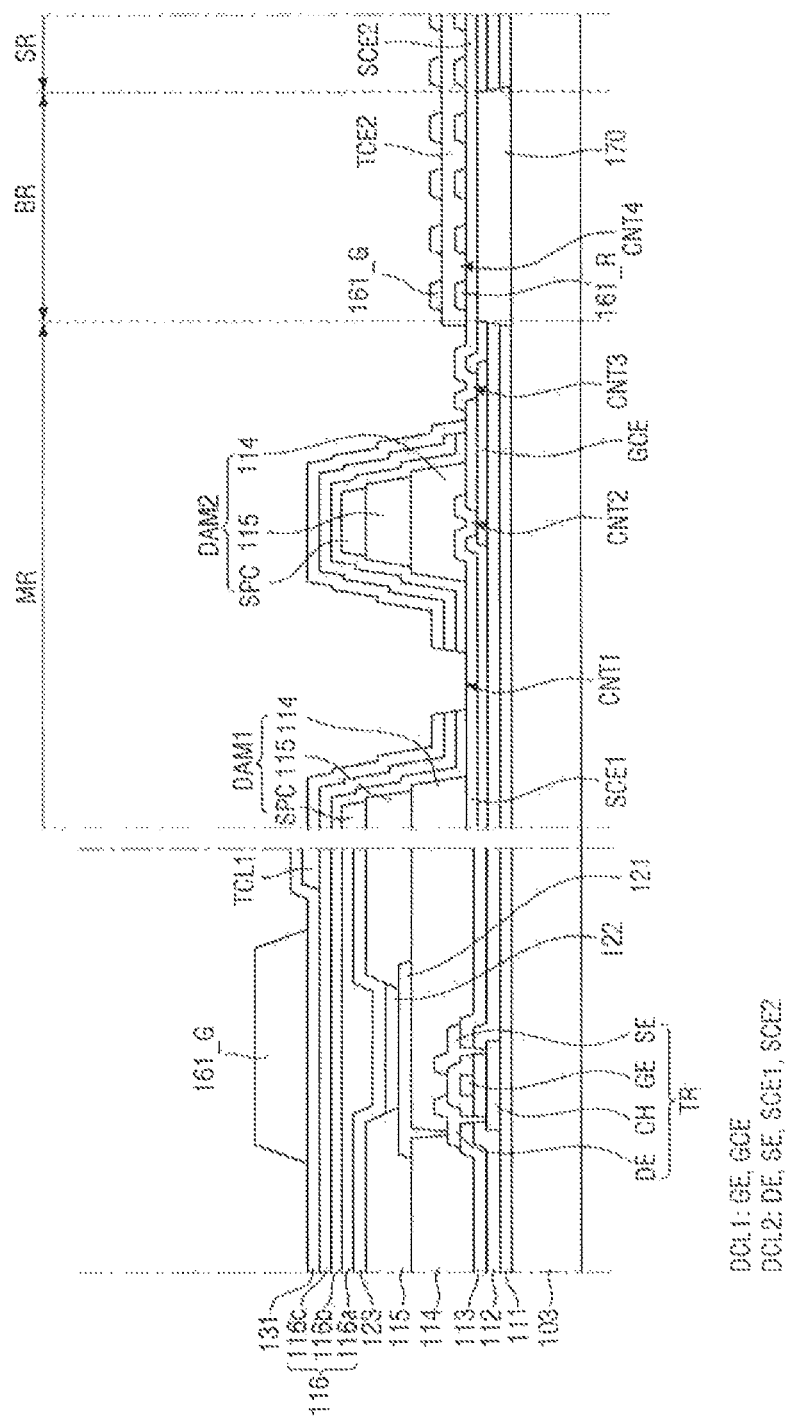

Referring to the illustrative embodiments of FIGS. 10 and 14, a second color filter 161_G is formed on the first touch insulating layer 131 in the main area MR and plurality of second color patterns of a second color filter 161_G is formed on the second touch connection electrode TCE2 in the sub-area SR and the bending area BR. The separation space of the adjacent second color patterns may overlap the separation space of the adjacent first color patterns. The second color pattern may overlap the first color pattern (e.g., in the thickness direction of the base substrate 103). The plurality of second color patterns of the second color filter 161_G may be disposed directly on the second touch connection electrode TCE2.

Figure 15:
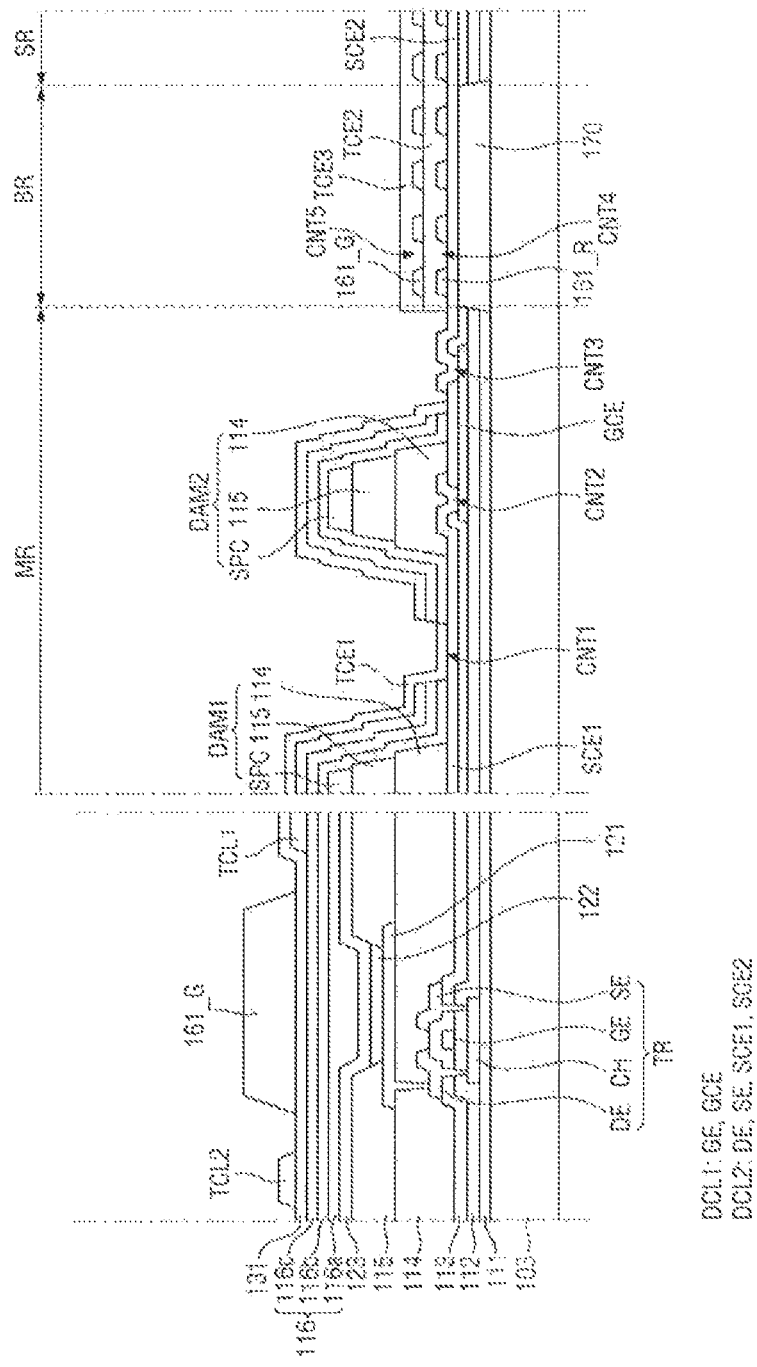

Subsequently, referring to the illustrative embodiments of FIGS. 11 and 15, in the main area MR, a second touch conductive layer TCL2 is formed on the first touch insulating layer 131 exposed by the second color filter 161_G. In the bending area BR and the sub-area SA, a second touch conductive layer TCL2 is disposed on the plurality of second color patterns of the second color filter 161_G separated from each other and the second touch connection electrodes TCE2.

In an illustrative embodiment, the second touch conductive layer TCL2 may include a plurality of first sensing electrodes IE1_1 to IE1_8, a plurality of second sensing electrodes IE2_1 to IE2_4 and a second touch bridge electrode CP2 electrically connecting adjacent second sensing electrodes IE2_1 to IE2_4 in the main area MR. The second touch conductive layer TCL2 may include a third touch connection electrode TCE3 in the sub-area SR and the bending area BR. The third touch connection electrode TCE3 may overlap and contact the second color patterns of the second color filter 161_G separated from each other and the second touch connection electrode TCE2 in the thickness direction. The third touch connection electrode TCE3 may be connected to the second touch connection electrode TCE2 through a separation space between adjacent second color patterns of the second color filter 161_G. The third touch connection electrode TCE3 may directly contact the upper surface and lateral side surfaces of the second color patterns of the second color filter 161_G.

Figure 16:
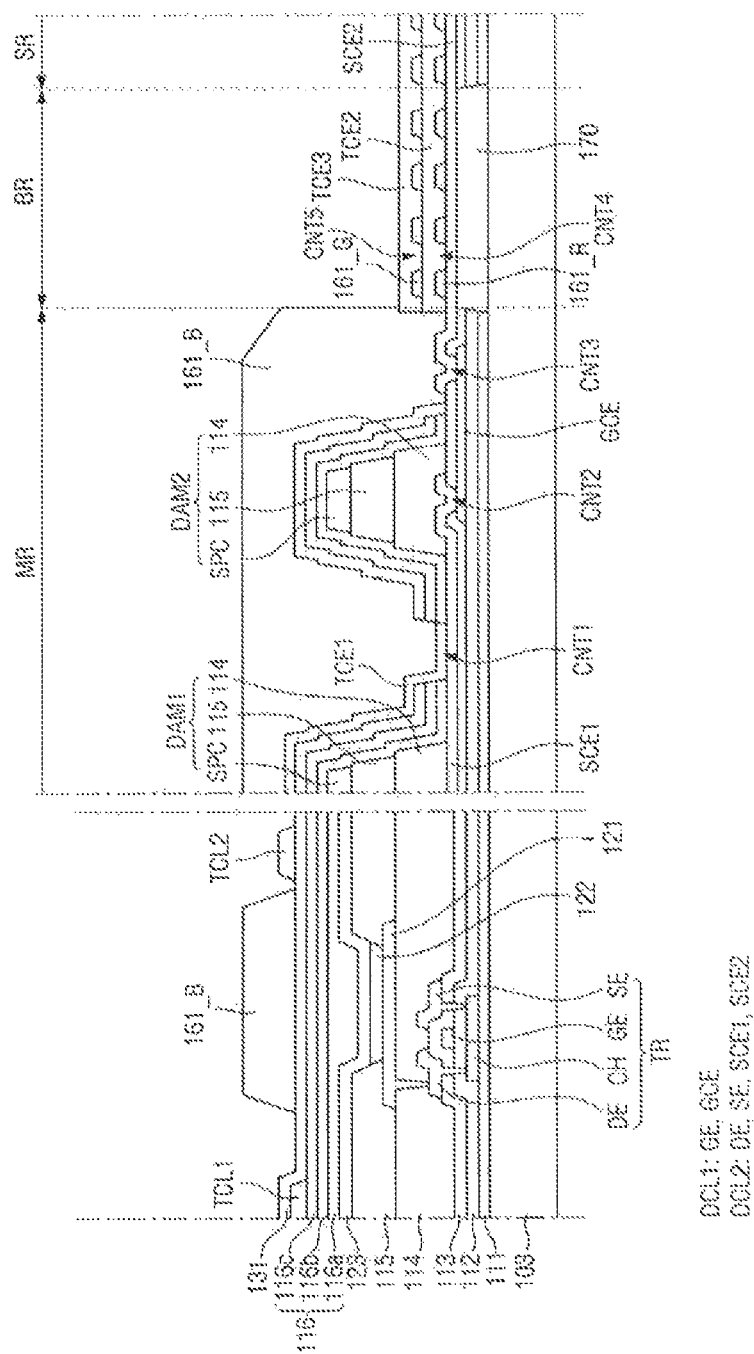

Referring to the illustrative embodiment of FIG. 16, in the main area MR, a third color filter 161_B is then formed on the second touch conductive layer TCL2, such as the first touch connection electrode TCE1. The third color filter 161_B may overlap and directly contact the second touch conductive layer TCL2, such as the first touch connection electrode TCE1 in the main area MR. The third color filter 161_B may be disposed at the boundary between the main area MR and the bending area BR. However, in an illustrative embodiment, a partial portion of the third color filter 161_B may also be disposed in the bending area BR.

Figure 17:
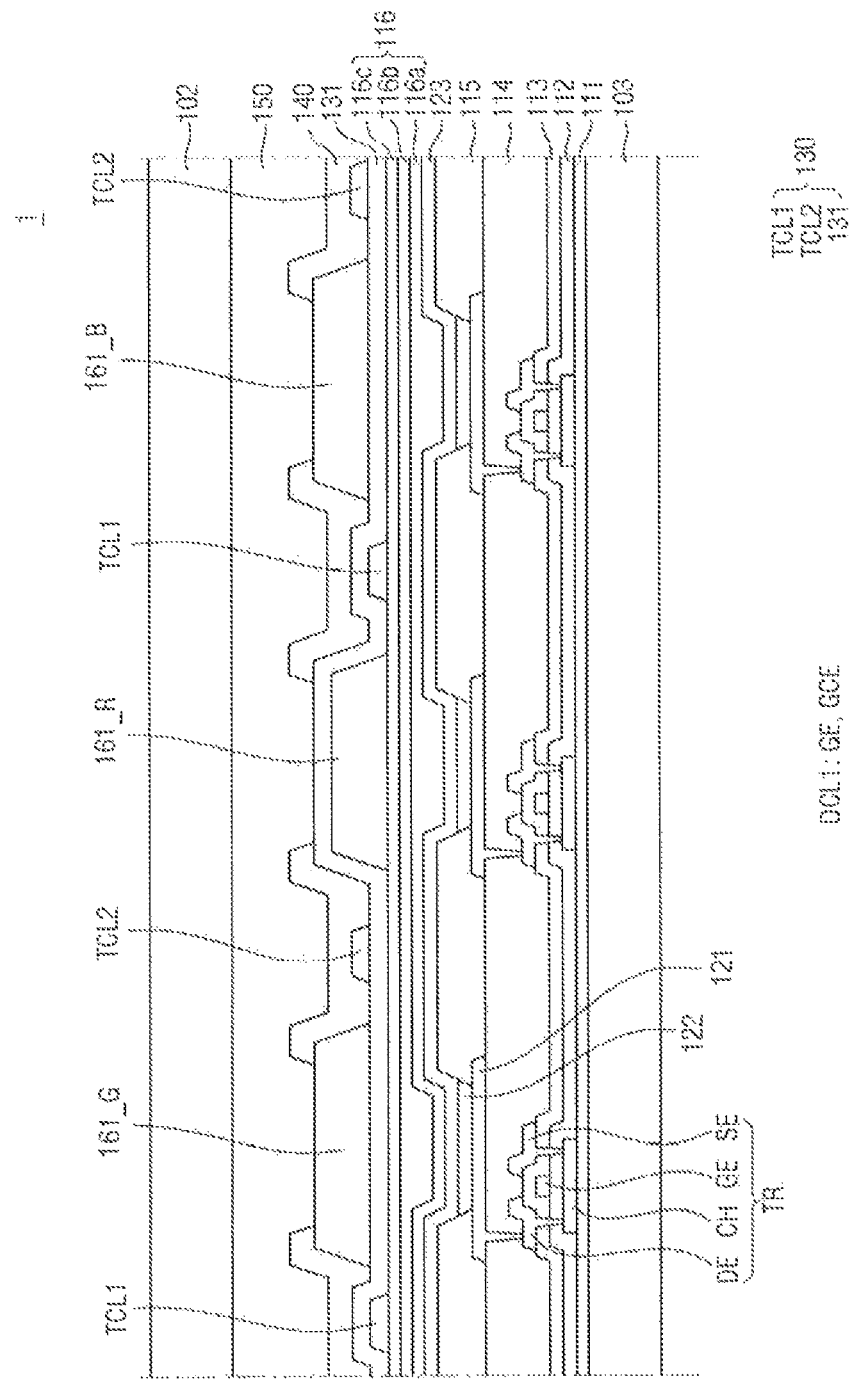
FIGS. 17 and 18 are cross-sectional views of a display device according to another illustrative embodiment of the present inventive concepts.

As shown in the illustrative embodiment of FIG. 17, a black matrix 140 is formed on the plurality of color filters in the main area MR. The black matrix 140 is disposed along the boundary of the pixel and includes an opening that exposes the pixel. In an illustrative embodiment, the black matrix 140 may have a lattice shape connected along a boundary of the pixel. The underlying organic light emitting layer 122 may overlap the opening of the black matrix 140.

The black matrix 140 may be formed to directly contact the first touch insulating layer 131, the second touch conductive layer TCL2, the second color filter 161_G, and the third color filter 161_B.

In an illustrative embodiment, the black matrix 140 may include a light absorbing material or a light reflecting material. For example, the black matrix 140 may include a resin colored in black or a reflective metal such as chromium (Cr).

As shown in the illustrative embodiment of FIG. 17, a window 102 is formed on the black matrix 140. In an illustrative embodiment, the window 102 may include a flexible material and may serve to cover the underlying configuration of the display device 1 as a whole. In an illustrative embodiment, the window 102 and the display panel 10 may be coupled to each other through an inter-module, adhesive layer.

Hereinafter, other illustrative embodiments of the present inventive concepts will be described.

Figure 18:
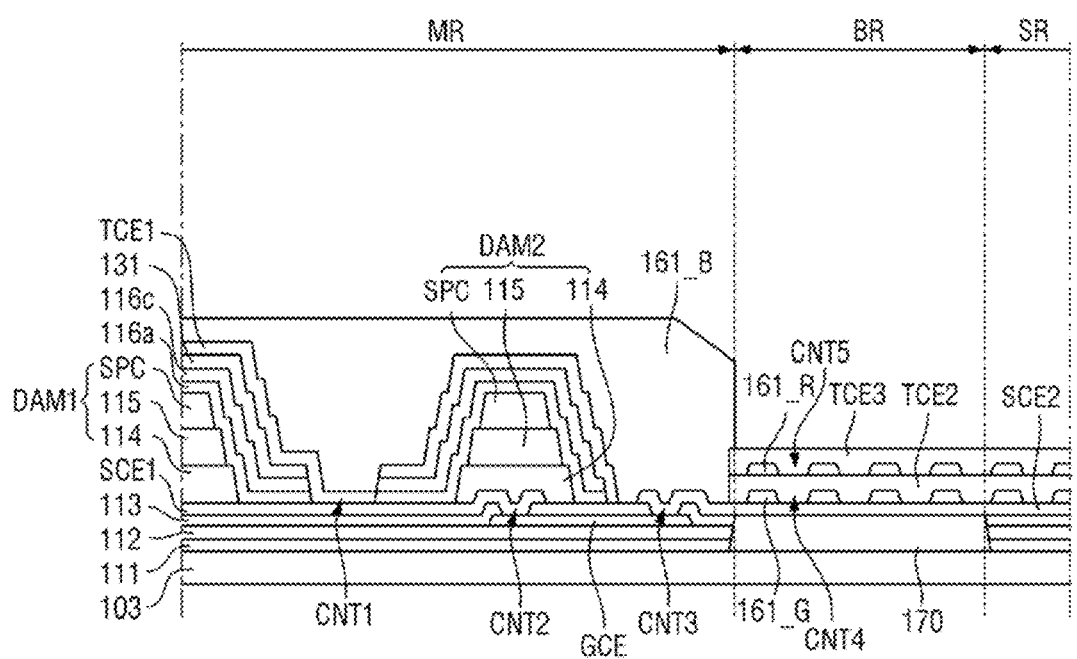

FIGS. 17 and 18 are cross-sectional views of a display device according to another illustrative embodiment of the present inventive concepts.

Referring to the illustrative embodiments of FIGS. 17 and 18, a display device according is different from the aforementioned display device in that the first color filter 161_R and the second color filter 161_G are arranged opposite to each other.

Since descriptions of the other elements have been provided above, a redundant description will be omitted for convenience of explanation.

Figure 19:
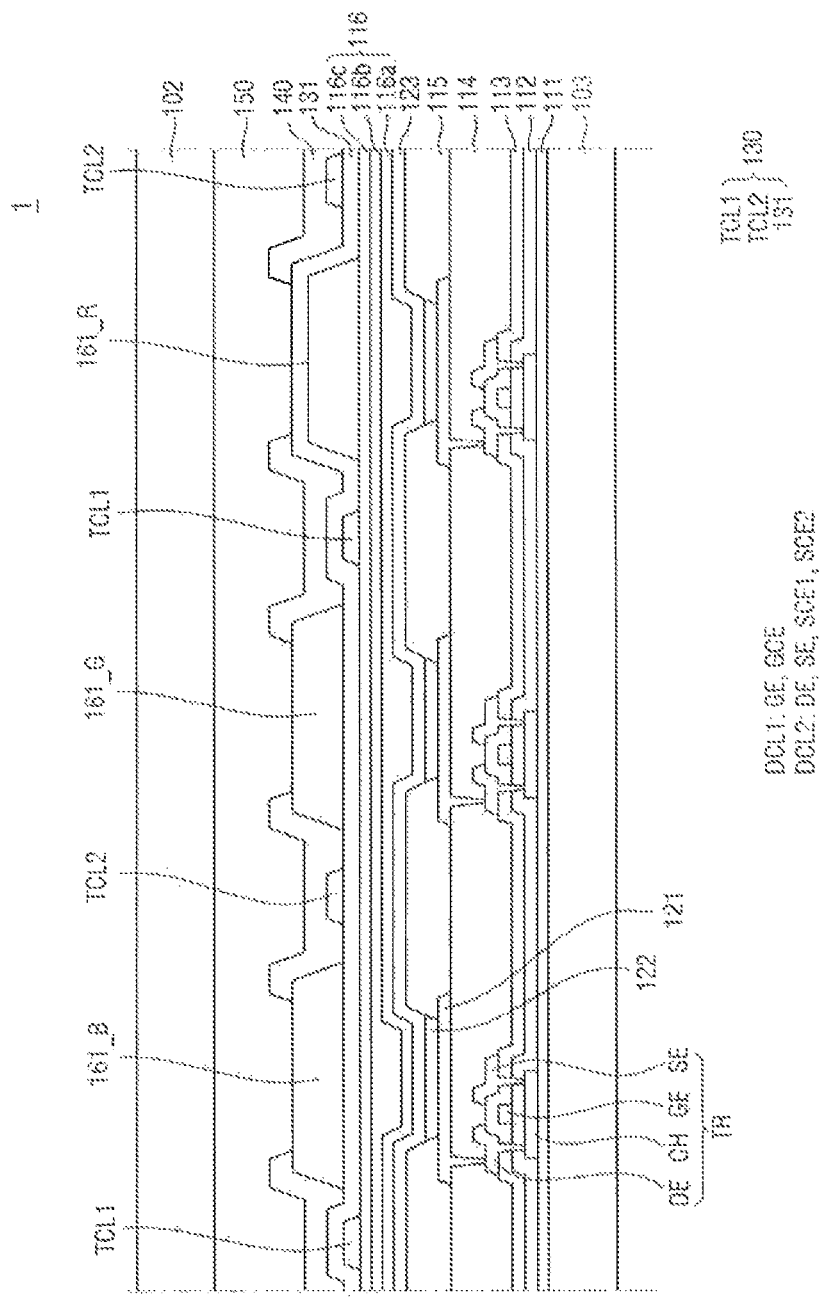
FIGS. 19 and 20 are cross-sectional views of a display device according to another illustrative embodiment of the present inventive concepts.
Figure 20:
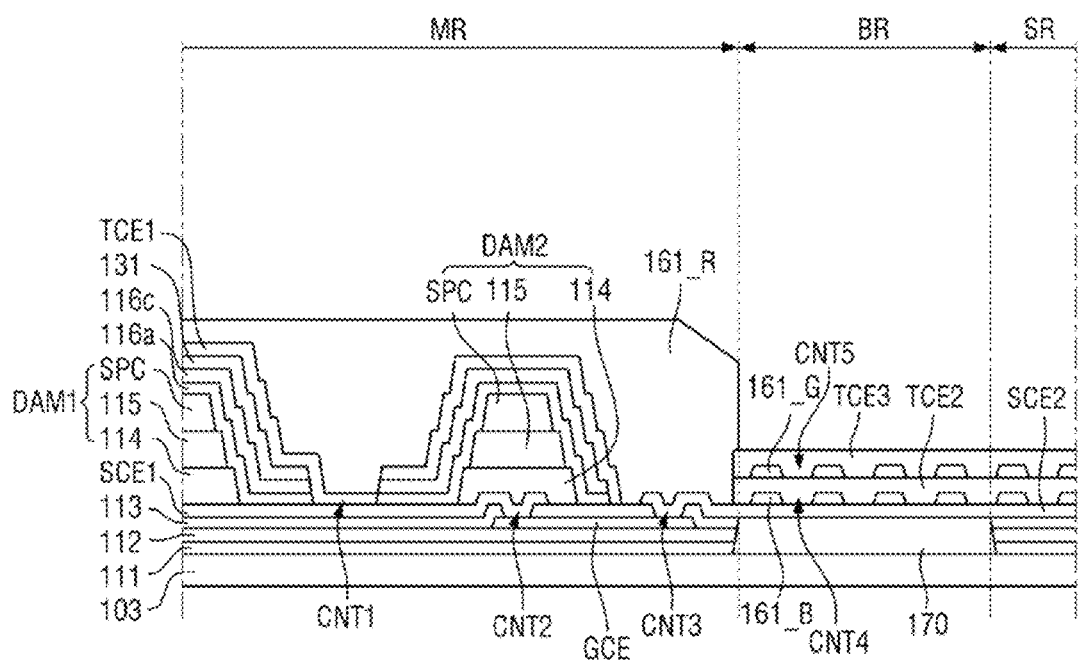

FIGS. 19 and 20 are cross-sectional views of a display device according to another illustrative embodiment of the present inventive concepts.

Referring to FIGS. 19 and 20, a display device according to the present illustrative embodiment is different from the display device shown in the illustrative embodiment of FIG. 6 in that the first color filter 161_R and the third color filter 161_B are arranged opposite to each other.

Since descriptions of the other elements have been provided above, a redundant description will be omitted for convenience of explanation.

Figure 21:
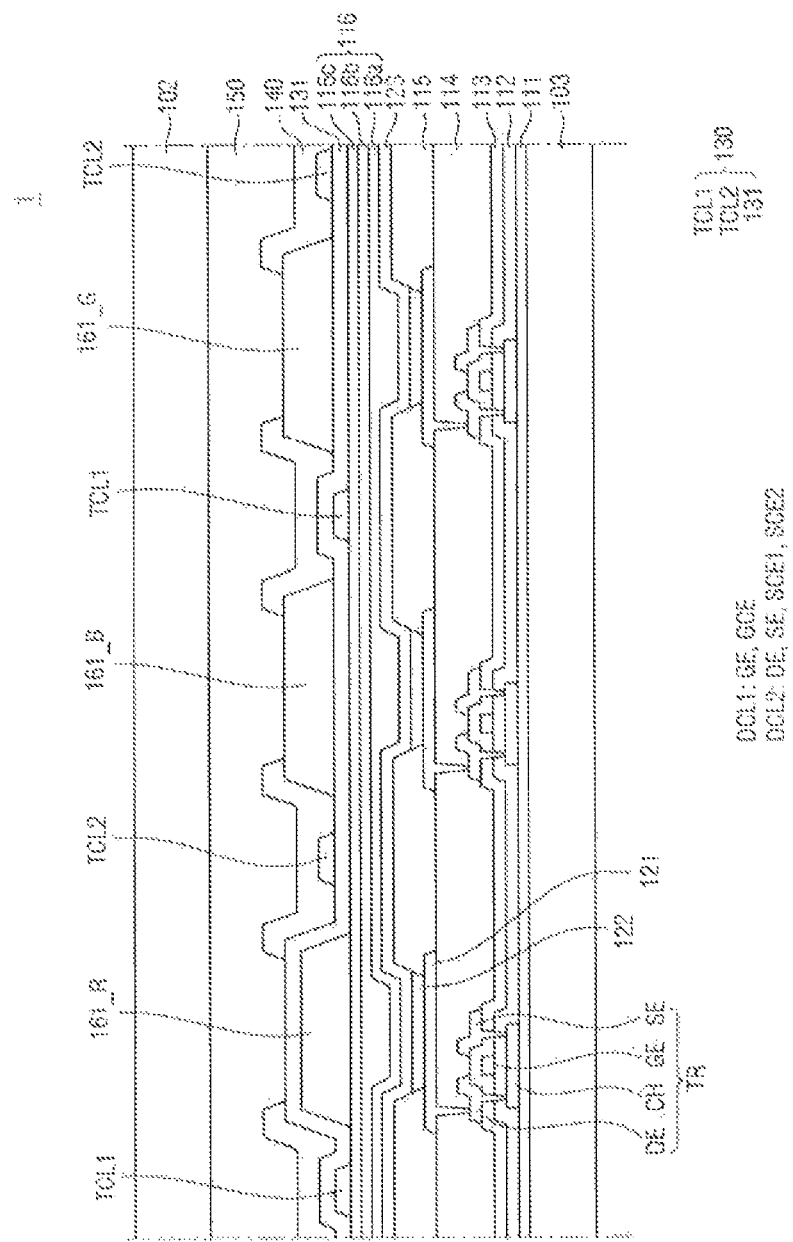
FIGS. 21 and 22 are cross-sectional views of a display device according to another illustrative embodiment of the present inventive concepts.
Figure 22:
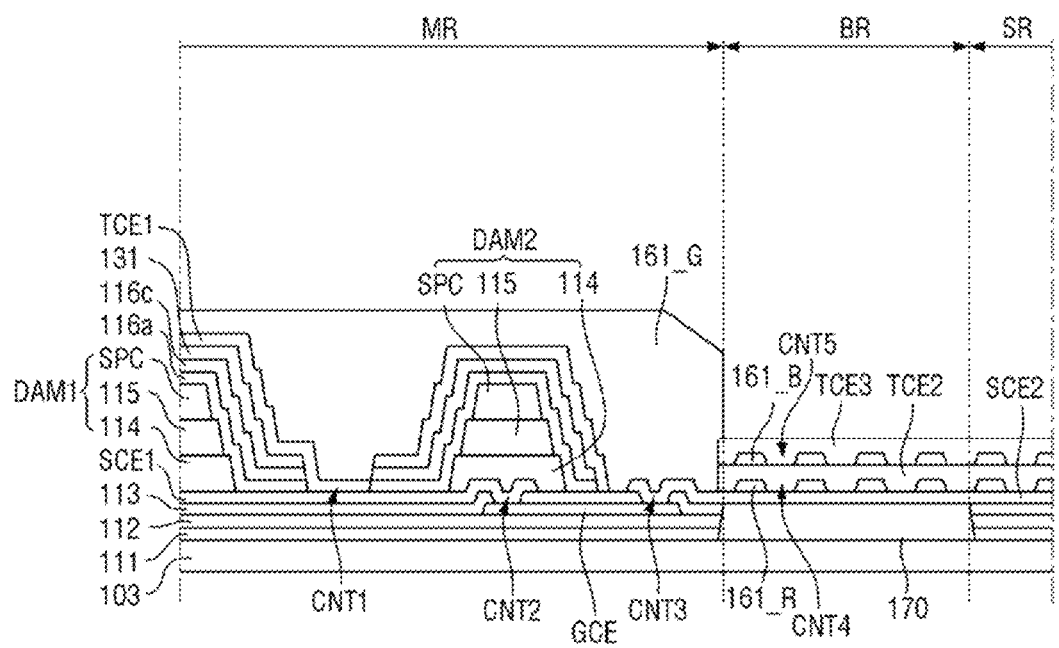

FIGS. 21 and 22 are cross-sectional views of a display device according to another illustrative embodiment of the present inventive concepts.

Referring to the illustrative embodiments of FIGS. 21 and 22, a display device is different from the aforementioned display device as shown in the illustrative embodiment of FIG. 6 in that the second color filter 161_G and the third color filter 161_B are arranged opposite to each other.

Since descriptions of the other elements have been provided above, a redundant description will be omitted for convenience of explanation.

Figure 23:
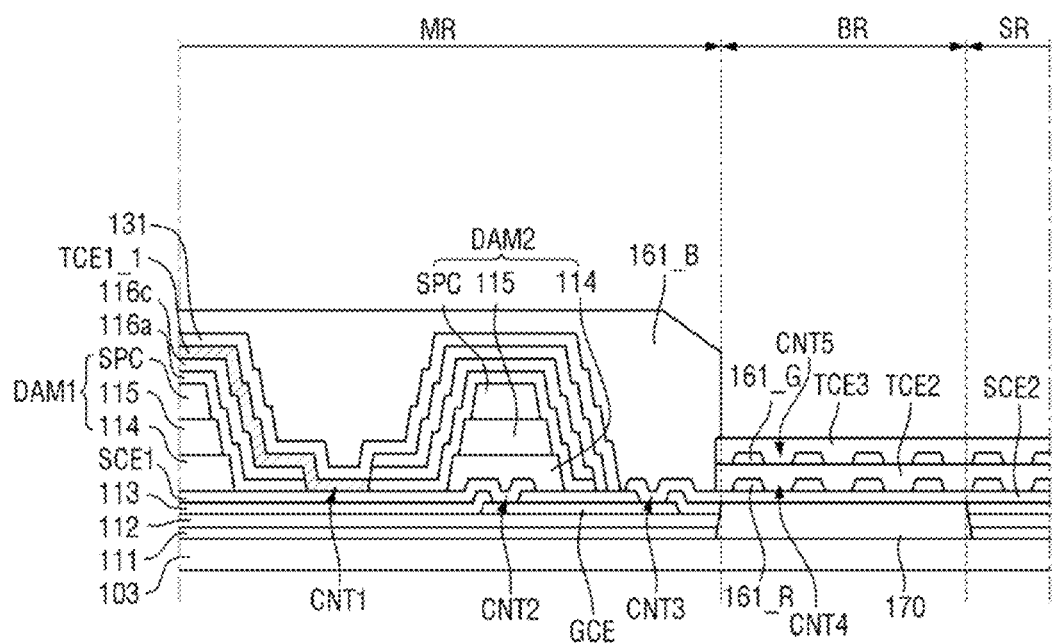
FIG. 23 is a cross-sectional view of a display device according to another illustrative embodiment of the present inventive concepts.

FIG. 23 is a cross-sectional view of a display device according to another illustrative embodiment of the present inventive concepts.

Referring to FIG. 23, a display device according to the present illustrative embodiment is different from the aforementioned display device in that the first touch connection electrode TCE1_1 is included in the first touch conductive layer TCL1.

For example, in the display device according to the illustrative embodiment of FIG. 23, the first touch connection electrode TCE1_1 may be included in the first touch conductive layer TCL1. The first touch connection electrode TCE1_1 may be disposed between the second encapsulation inorganic layer 116c of the encapsulation layer 116 and the first touch insulating layer 131.

Since descriptions of the other elements have been provided above, a redundant description will be omitted for convenience of explanation.

Figure 24:
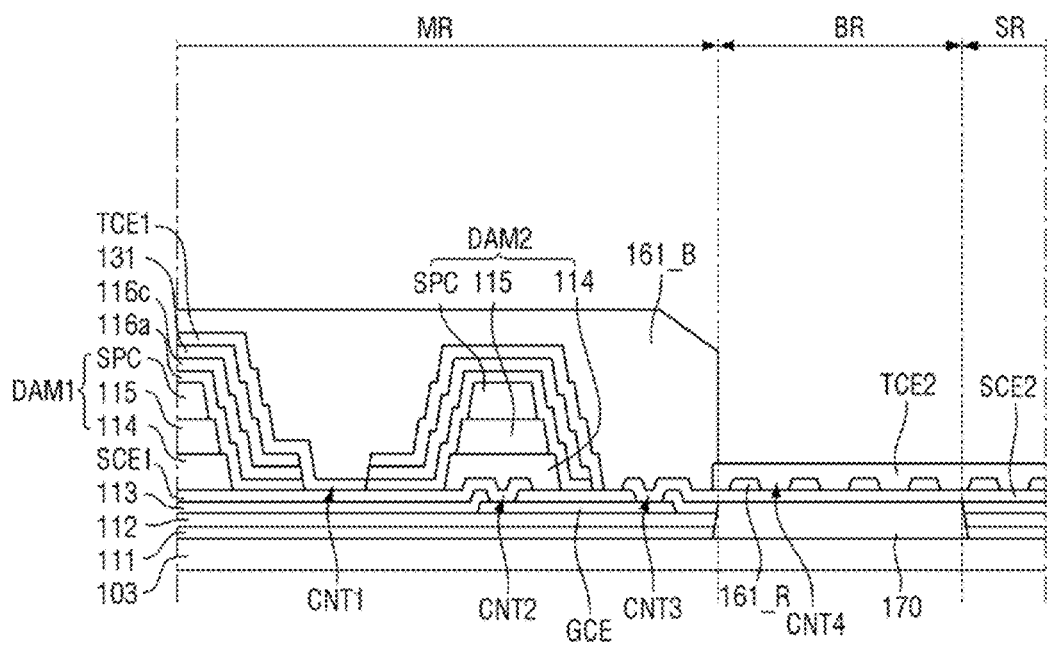
FIG. 24 is a cross-sectional view of a display device according to another illustrative embodiment of the present inventive concepts.

FIG. 24 is a cross-sectional view of a display device according to another illustrative embodiment of the present inventive concepts.

Referring to the illustrative embodiment of FIG. 24, a display device according to the present illustrative embodiment is different from the display device show in the illustrative embodiments of FIGS. 8-9 in that the third touch connection electrode TCE3 and the second color pattern of the second color filter 161_G are omitted from the bending area BR and the sub-area SR.

Since descriptions of the other elements have been provided above, a redundant description will be omitted for convenience of explanation.

Figure 25:
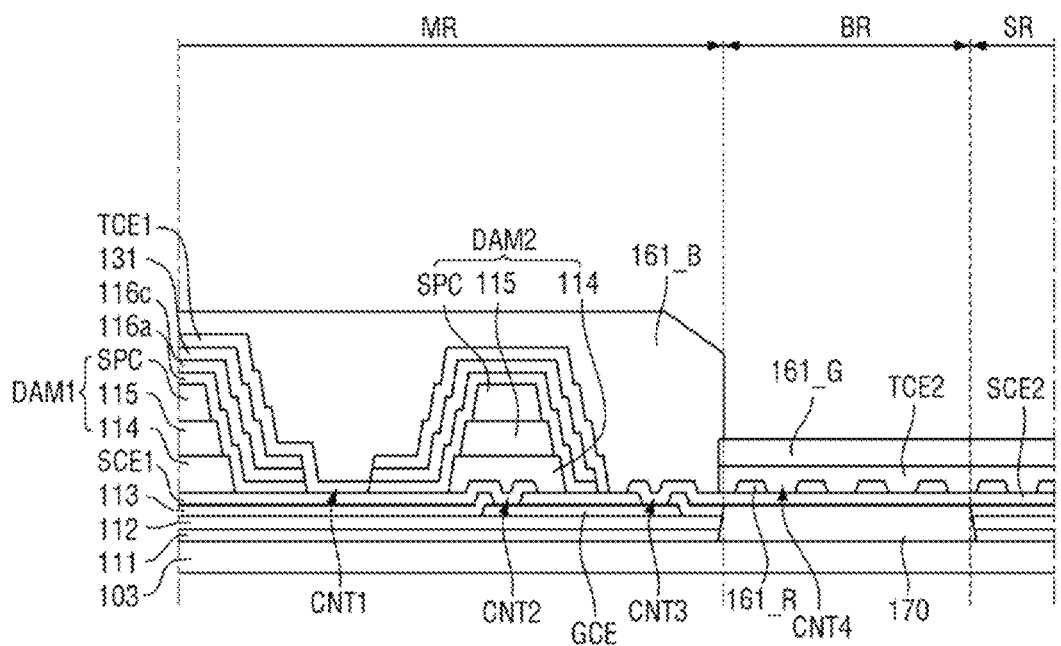
FIG. 25 is a cross-sectional view of a display device according to another illustrative embodiment of the present inventive concepts.

FIG. 25 is a cross-sectional view of a display device according to another illustrative embodiment of the present inventive concepts.

Referring to FIG. 25, a display device according to the present illustrative embodiment is different from the aforementioned display device in that, in the bending area BR and the sub-area SR, the second color filter 161_G does not include a plurality of second color patterns separated from each other. Instead, the second color filter 161_G in the bending area BR and the sub-area SR includes one second color pattern that is integrally formed.

As shown in the illustrative embodiment of FIG. 25, the integrally formed second color pattern of the second color filter 161_G may overlap and contact the second touch connection electrode TCE2, and may overlap the plurality of first color patterns that are separated from each other.

Since descriptions of the other elements have been provided above, a redundant description will be omitted for convenience of explanation.

Figure 26:
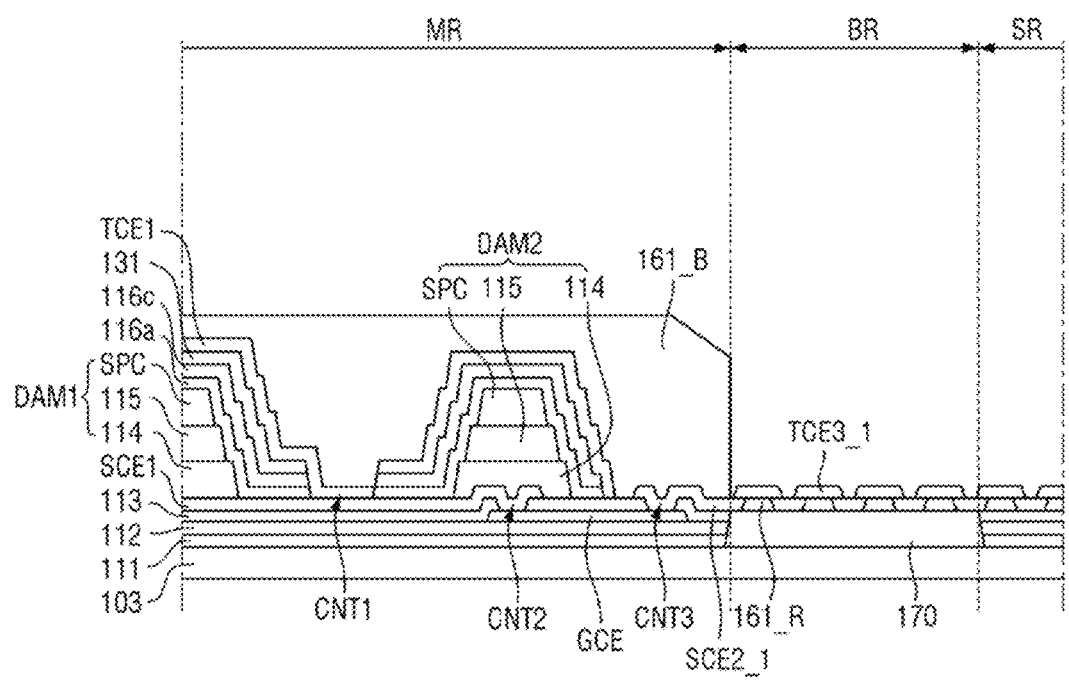
FIG. 26 is a cross-sectional view of a display device according to another illustrative embodiment of the present inventive concepts.

FIG. 26 is a cross-sectional view of a display device according to another illustrative embodiment of the present inventive concepts.

Referring to FIG. 26, a display device according to the present illustrative embodiment is different from the display device shown in the illustrative embodiment of FIG. 8 in that the second source connection electrode SCE2_1 includes a plurality of second source connection electrode patterns that are separated from each other in the bending area BR. A plurality of first color patterns of the first color filter 161_R are disposed in the separation spaces between adjacent second source connection electrode patterns of the second source connection electrode SCE2_1 in the bending area BR. A third touch connection electrode TCE3_1 includes a plurality of third touch electrode patterns that are separated from each other in the bending area BR.

Each of the plurality of third touch electrode patterns of the third touch connection electrode TCE3_1 may overlap the first color patterns of the first color filter 161_R and is connected to the adjacent second source connection electrode patterns of the second source connection electrode SCE2_1. For example, as shown in the illustrative embodiment of FIG. 26, a lower surface of the third touch connection electrode TCE3_1 may directly contact the upper surface of the first color pattern of the first color filter 161_R and a partial portion of the upper surface of the second source connection electrode patterns of the second source connection electrode SCE2_1. However, illustrative embodiments of the present inventive concepts are not limited thereto.

The plurality of touch electrode patterns of the third touch connection electrode TCE3_1 may be included in the second touch conductive layer TCL2.

Figure 27:
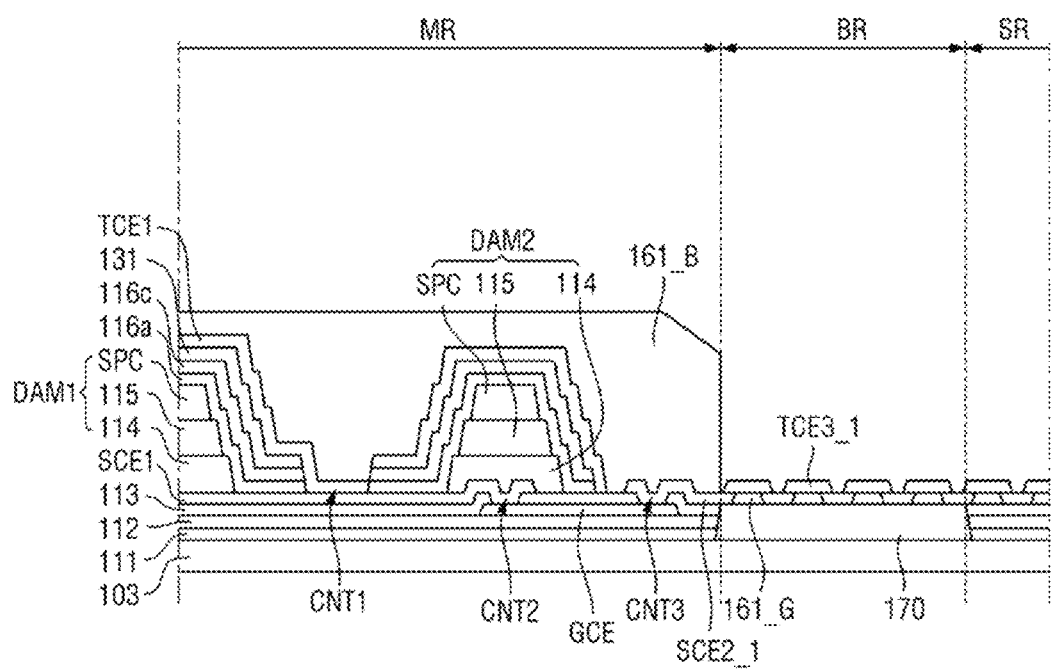
FIG. 27 is a cross-sectional view of a display device according to another illustrative embodiment of the present inventive concepts.

FIG. 27 is a cross-sectional view of a display device according to another illustrative embodiment of the present inventive concepts.

Referring to FIG. 27, a display device according to the present illustrative embodiment is different from the aforementioned display device of FIG. 26 in that the first color pattern of the first color filter 161_R is omitted in the bending area BR and the sub-area SR and the second color pattern of the second color filter 161_G is disposed in the separation spaces between the plurality of adjacent second source connection electrode patterns of the second source connection electrode SCE2_1 in the bending area BR.

Since descriptions of the other elements have been provided above, a redundant description will be omitted for convenience of explanation.

Figure 28:
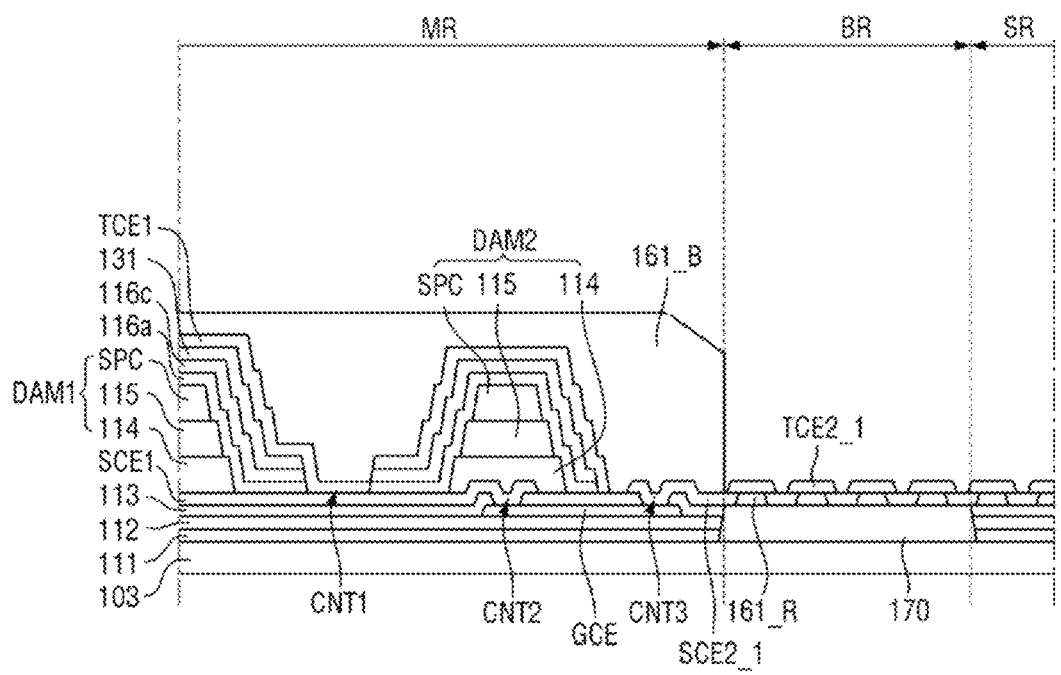
FIG. 28 is a cross-sectional view of a display device according to another illustrative embodiment of the present inventive concepts.

FIG. 28 is a cross-sectional view of a display device according to another illustrative embodiment of the present inventive concepts.

Referring to FIG. 28, a display device according to the present illustrative embodiment is different from the aforementioned display device of FIG. 26 in that the third touch connection electrode TCE3_1 is omitted and the display device includes a second touch connection electrode TCE2_1 including a plurality of touch electrode patterns separated from each other.

Each of the plurality of second touch electrode patterns of the second touch connection electrode TCE2_1 may overlap the first color pattern of the first color pattern 161_R and are connected to the adjacent second source connection electrode patterns of the second source connection electrode SCE2_1. The first color pattern of the first color filter 161_R may be in direct contact with the adjacent second source connection electrode pattern of the second source connection electrode SCE2_1, and the second touch electrode pattern of the second touch connection electrode TCE2_1 may directly contact the first color pattern of the first color filter 161_R and the second source connection electrode pattern of the second source connection electrode SCE2_1. For example, as shown in the illustrative embodiment of FIG. 28, a lower surface of the second touch connection electrode TCE2_1 may directly contact the upper surface of the first color pattern of the first color filter 161_R and a partial portion of the upper surface of the second source connection electrode patterns of the second source connection electrode SCE2_1. However, illustrative embodiments of the present inventive concepts are not limited thereto.

The plurality of second touch electrode patterns of the second touch connection electrode TCE2_1 may be included in the first touch conductive layer TCL1.

Figure 29:
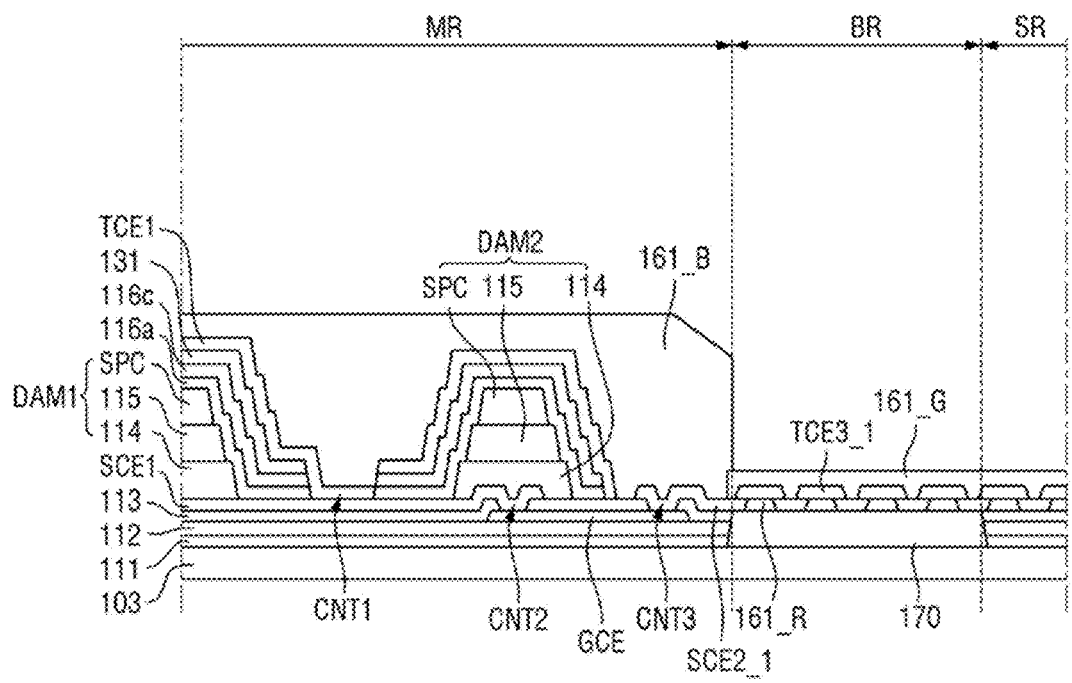
FIG. 29 is a cross-sectional view of a display device according to another illustrative embodiment of the present inventive concepts.

FIG. 29 is a cross-sectional view of a display device according to another illustrative embodiment of the present inventive concepts.

Referring to FIG. 29, a display device according to the present embodiment is different from the aforementioned display device of FIG. 26 in that a second color filter 161_G is further disposed on the third touch connection electrode TCE3_1 and the plurality of second source connection electrode patterns of the second source connection electrode SCE2_1 exposed by the third touch connection electrode TCE3_1.

Since descriptions of the other elements have been provided above, a redundant description will be omitted for convenience of explanation.

According to the display device according to an illustrative embodiment of the present inventive concepts and the method of manufacturing the same, bending characteristics may be improved in a bending area.

The effects of the present inventive concepts are not limited by the foregoing, and other various effects are anticipated herein.

Although illustrative embodiments of the present inventive concepts have been disclosed for illustrative purposes, those skilled in the art will appreciate that various modifications, additions and substitutions are possible, without departing from the scope and spirit of the present inventive concepts.

In concluding the detailed description, those skilled in the art will appreciate that harry variations and modifications can be made to the illustrative embodiments without substantially departing from the principles of the present inventive concepts. Therefore, the disclosed illustrative embodiments of the invention are used in a generic and descriptive sense only and not for purposes of limitation.

What is claimed is:

1. A display device, comprising:
   a base substrate having a main area, a sub-area, and a bending area disposed between the main area and the sub-area, the main area including a plurality of pixels that each include a thin film transistor having a semiconductor layer, a gate electrode, a source electrode and a drain electrode;
a first insulating layer disposed on the semiconductor layer;
a first conductive layer disposed on the first insulating layer and including the gate electrode of the thin film transistor;
a second insulating layer is disposed on the first conductive layer;
wherein the bending area includes a bending organic layer disposed in a bending open portion that penetrates the first insulating layer and the second insulating layer,
wherein the display device further comprises:
a second conductive layer disposed on the second insulating layer, the second conductive layer including the source electrode or the drain electrode of the thin film transistor, and a source connection electrode overlapping the bending organic layer;
a light emitting element disposed on the second conductive layer for each of the pixels;
an encapsulation layer covering the light emitting element; and
a touch layer and a color filter layer disposed on the encapsulation layer,
wherein:
the color filter layer includes a plurality of first color patterns directly contacting the source connection electrode in the bending area, and
adjacent first color patterns of the plurality of first color patterns are separated from each other and include a separation space therebetween.

2. A display device, comprising:
a base substrate having a main area, a sub-area, and a bending area disposed between the main area and the sub-area, the main area including a plurality of pixels that each include a thin film transistor having a semiconductor layer, a gate electrode, a source electrode and a drain electrode;
a first insulating layer disposed on the semiconductor layer;
a first conductive layer disposed on the first insulating layer and including the gate electrode of the thin film transistor;
a second insulating layer disposed on the first conductive layer;
wherein the bending area includes a bending organic layer disposed in a bending open portion that penetrates the first insulating layer and the second insulating layer,
wherein the display device further comprises:
a second conductive layer disposed on the second insulating layer, the second conductive layer including the source electrode or the drain electrode of the thin film transistor, and a source connection electrode overlapping the bending organic layer;
a light emitting element disposed on the second conductive layer for each of the pixels;
an encapsulation layer covering the light emitting element; and
a touch layer and a color filter layer disposed on the encapsulation layer,
wherein:
the color filter layer includes a plurality of first color patterns overlapping the source connection electrode in the bending area,
adjacent first color patterns of the plurality of first color patterns are separated from each other and include a separation space therebetween,
the touch layer includes a first touch connection electrode connected to the source connection electrode through a first contact hole in the encapsulation layer in the main area and a second touch connection electrode overlapping the source connection electrode in the bending area, and
the second touch connection electrode is disposed on the plurality of first color patterns and is connected to the source connection electrode through the separation space between the adjacent first color patterns of the plurality of first color patterns.

3. The display device of claim 2, wherein:
the second touch connection electrode directly contacts lateral side surfaces and an upper surface of each of the plurality of first color patterns.

4. The display device of claim 3, wherein
the bending organic layer directly contacts the source connection electrode.

5. The display device of claim 4, wherein the plurality of first color patterns and the second touch connection electrode are further disposed in the sub-area.

6. The display device of claim 5, wherein:
the color filter layer further comprises a first color filter, a second color filter, and a third color filter, and
wherein the plurality of first color patterns is composed of the first color filter.

7. The display device of claim 6, wherein:
the second color filter includes a plurality of second color patterns overlapping the second touch connection electrode in the bending area;
adjacent second color patterns of the plurality of second color patterns are separated from each other and have a separation space therebetween; and
the plurality of second color patterns directly contacts the second touch connection electrode.

8. The display device of claim 7, wherein the separation space between the adjacent second color patterns of the plurality of second color patterns overlaps the separation space between the adjacent first color patterns of the plurality of first color patterns.

9. The display device of claim 8, wherein:
the touch layer further includes a third touch connection electrode overlapping the second touch connection electrode,
the third touch connection electrode is disposed on the plurality of second color patterns and is connected to the second touch connection electrode through the separation space between the adjacent second color patterns of the plurality of second color patterns; and
the third touch connection electrode directly contacts lateral side surfaces and an upper surface of each of the plurality of second color patterns.

10. The display device of claim 9, wherein:
the source connection electrode includes a first source connection electrode disposed in the main area and a second source connection electrode spaced apart from the first source connection electrode;
the first conductive layer further includes a gate connection electrode connected to the first source connection electrode and the second source connection electrode through second and third contact holes of the second insulating layer, respectively; and the second source connection electrode is disposed over a portion of the main area, the bending area, and the sub-area, and directly contacts the bending organic layer.

11. The display device of claim 9, wherein:
the touch layer includes a first touch conductive layer, a first touch insulating layer disposed on the first touch conductive layer, and a second touch conductive layer disposed on the first touch insulating layer, and
wherein the third color filter is disposed on the touch layer and directly contacts the second touch conductive layer.

12. The display device of claim 11, wherein:
the first touch conductive layer includes the second touch connection electrode; and
the second touch conductive layer includes the first touch connection electrode and the third touch connection electrode.

13. The display device of claim 11, wherein:
the first touch conductive layer includes the first touch connection electrode and the second touch electrode; and
the second touch conductive layer includes the third touch connection electrode.

14. The display device of claim 11, wherein:
the first touch conductive layer is disposed on the encapsulation layer;
the first touch insulating layer is disposed on the first touch conductive layer;
the second color filter is disposed on the first touch insulating layer;
the second touch conductive layer is disposed on the second color filter; and
the third color filter is disposed on the second touch conductive layer.

15. The display device of claim 6, wherein:
the second color filter is integrally formed in the bending area and the sub-area, and the integrally formed second color filter overlaps the plurality of first color patterns.

16. The display device of claim 2, wherein:
the bending area is configured to be bent along a thickness direction;
the main area overlaps the sub-area in the thickness direction when the bending area is bent; and
the display device further comprises a driving chip disposed in the sub-area and a driving substrate electrically connected to the driving chip.

17. A display device, comprising:
a base substrate having a main area, a sub-area, and a bending area disposed between the main area and the sub-area, the main area including a plurality of pixels that each include a thin film transistor having a semiconductor layer, a gate electrode, a source electrode and a drain electrode;
a first insulating layer disposed on the semiconductor layer;
a first conductive layer disposed on the first insulating layer and including the gate electrode of the thin film transistor;
a second insulating layer disposed on the first conductive layer;
wherein the bending area includes a bending organic layer disposed in a bending open portion that penetrates the first insulating layer and the second insulating layer,
wherein the display device further comprises:
a second conductive layer disposed on the second insulating layer, the second conductive layer including the source electrode or the drain electrode of the thin film transistor, and a source connection electrode overlapping the bending organic layer;
a light emitting element disposed on the second conductive layer for each of the pixels;
an encapsulation layer covering the light emitting element; and
a touch layer and a color filter layer disposed on the encapsulation layer,
wherein:
the color filter layer includes a plurality of first color patterns overlapping the source connection electrode in the bending area,
adjacent first color patterns of the plurality of first color patterns are separated from each other and include a separation space therebetween,
the source connection electrode includes a plurality of source connection electrode patterns separated from each other in the bending area,
the plurality of source connection electrode patterns are arranged in the separation spaces between adjacent first color patterns of the plurality of first color patterns,
the touch layer includes a first touch connection electrode connected to the source connection electrode through a contact hole in the encapsulation layer in the main area and a second touch connection electrode including a plurality of second touch electrode patterns separated from each other in the bending area,
the plurality of second touch electrode patterns overlaps the plurality of first color patterns and is connected to the plurality of source connection electrode patterns,
the plurality of first color patterns of the first color filter directly contacts adjacent source connection electrode patterns of the plurality of source connection electrode patterns, and
the plurality of second touch electrode patterns directly contacts the plurality of first color patterns and the plurality of source connection electrode patterns.

18. A method of manufacturing a display device, the method comprising:
forming a base substrate having a main area, a sub-area, and a bending area disposed between the main area and the sub-area, the main area including a plurality of pixels that each include a thin film transistor having a semiconductor layer, a gate electrode, a source electrode and a drain electrode;
forming a gate insulating layer on the semiconductor layer;
forming a first conductive layer including the gate electrode of the thin film transistor on the gate insulating layer;
forming an interlayer insulating layer on the first conductive layer;
forming a bending organic layer in a bending open portion penetrating the gate insulating layer and the interlayer insulating layer in the bending area;
forming a second conductive layer on the interlayer insulating layer, the second conductive layer including the source electrode or the drain electrode of the thin film transistor, and a source connection electrode overlapping the bending organic layer;
forming a light emitting element on the second conductive layer for each pixel of the plurality of pixels;
forming an encapsulation layer covering the light emitting element; and forming a plurality of first color patterns directly contacting the source connection electrode in the bending area, the plurality of first color patterns are separated from each other.

19. The method of claim 18, further comprising:
forming a first touch connection electrode overlapping the source connection electrode in the bending area, wherein the first touch connection electrode is formed on the plurality of first color patterns, and is connected to the source connection electrode through a separation space between adjacent first color patterns of the plurality of first color patterns.

20. The method of claim 18, wherein:
in the forming of the second conductive layer, the source connection electrode is formed into a plurality of source electrode connection patterns separated from each other in the bending area and including separation spaces between adjacent source electrode connection patterns of the plurality of source electrode connection patterns; and
the plurality of first color patterns are subsequently formed in the separation spaces between adjacent source electrode connection patterns of the plurality of source electrode connection patterns in the bending area; and
a first touch connection electrode is formed in the main area, the first touch connection electrode is connected to the source connection electrode through a contact hole in the encapsulation layer in the main area; and
a second touch connection electrode including a plurality of touch electrode patterns is formed in the bending area.

\* \* \* \* \*